United States Patent
Honda et al.

[11] Patent Number: 5,867,115
[45] Date of Patent: Feb. 2, 1999

[54] SIGNAL PROCESSING CIRCUIT WITH OFFSET COMPENSATION

[75] Inventors: Takayoshi Honda, Nagoya; Takahiko Hasegawa, Nukata-gun, both of Japan

[73] Assignee: Nippondenso Co., Ltd., Kariya, Japan

[21] Appl. No.: 689,563

[22] Filed: Aug. 12, 1996

[30] Foreign Application Priority Data

Nov. 6, 1995 [JP] Japan ................................... 7-286307

[51] Int. Cl.⁶ .................................................. H03M 1/10
[52] U.S. Cl. .......................................... 341/120; 341/118
[58] Field of Search .................................. 341/118, 120, 341/155, 158

[56] References Cited

U.S. PATENT DOCUMENTS

| 5,172,115 | 12/1992 | Kerth et al. | 341/118 |
| 5,245,340 | 9/1993 | Loo et al. | 341/118 |

FOREIGN PATENT DOCUMENTS

| A-56-116146 | 2/1980 | Japan . |
| A-59-49351 | 9/1982 | Japan . |
| A-2-75744 | 9/1988 | Japan . |

*Primary Examiner*—Brian K. Young
*Attorney, Agent, or Firm*—Nixon & Vanderhye P.C.

[57] ABSTRACT

An A/D-converter for a knock determination of an engine performs A/D-conversion with respect to a knock signal having a reference voltage and to another sensor signal having a reference voltage that differs therefrom. When the engine rotation is less than 1000 rpm, since the knock signal is too small to perform malfunction determination, integration of "0" point data (reference voltage: 2.5V) of an integrating circuit is performed within a knock determination time period. The resulting data is A/D-converted by the A/D-converter to thereby update the "0" point value stored in a RAM. On the other hand, in a range of greater than 1000 rpm where malfunction determination can be performed of the knock sensors, within the knock determination time period, the knock signal is integrated using the integrating circuit.

23 Claims, 25 Drawing Sheets

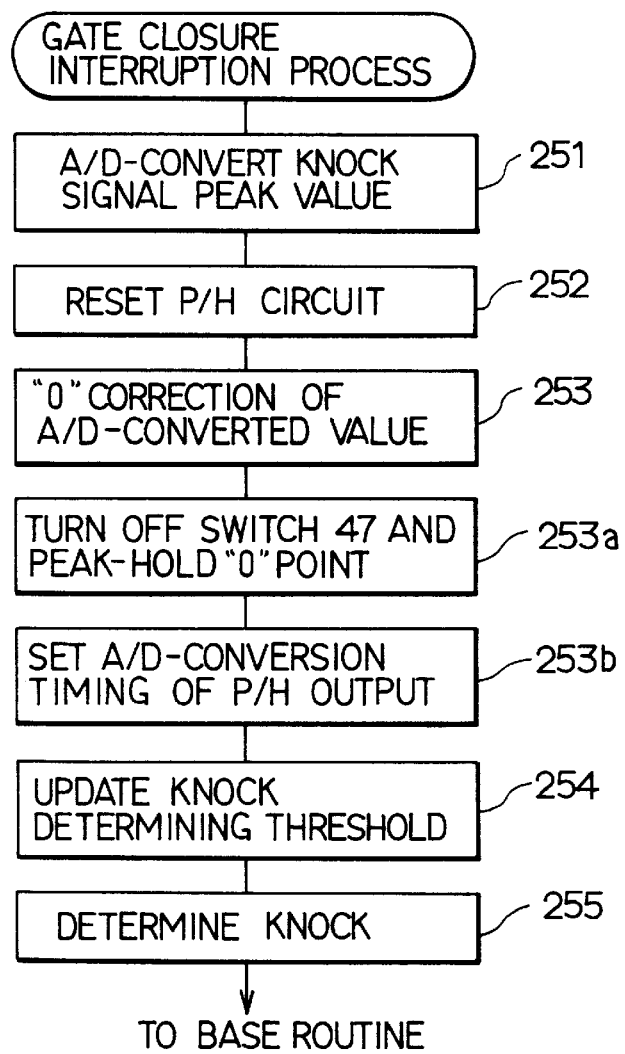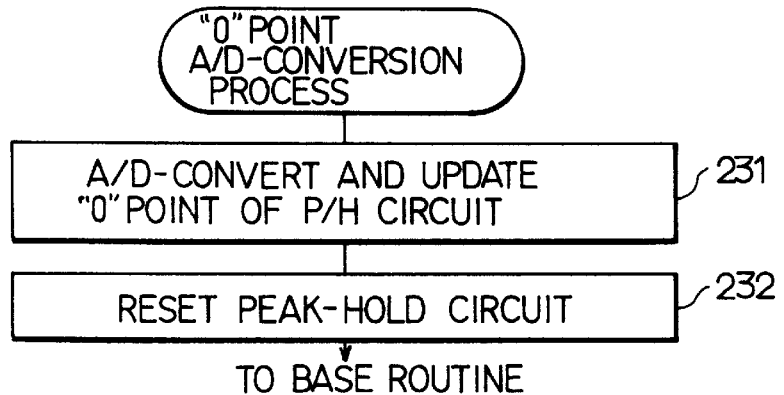

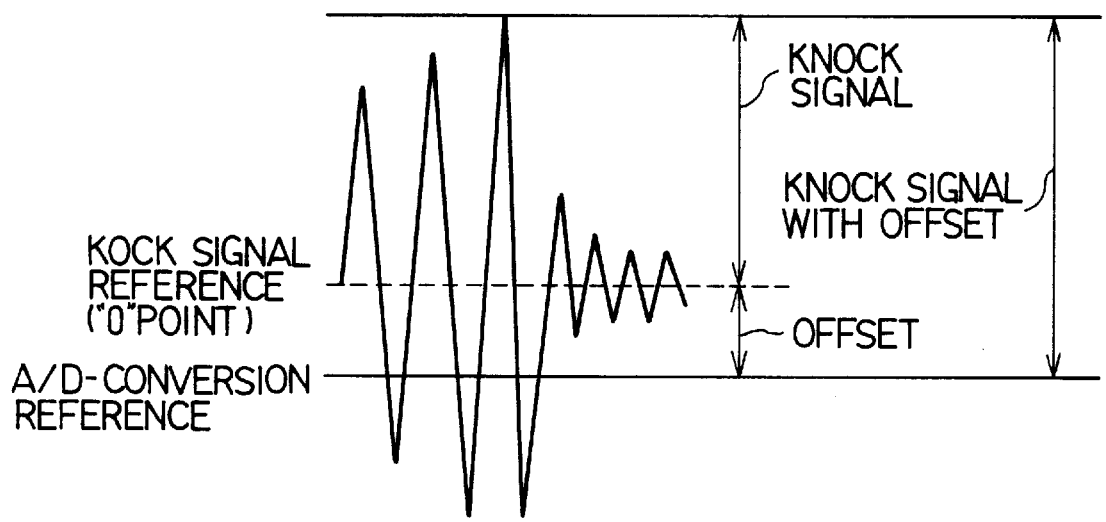

SIGNAL PROCESSING CIRCUIT WITH OFFSET COMPENSATION

BACKGROUND OF THE INVENTION

1. Field of the Invention

The present invention relates to a signal processing circuit which is arranged to perform by a single A/D-converter analog-to-digital (A/D) conversion of two kinds of analog signals that differ in reference voltages thereof.

2. Description of Related Art

Conventionally, in an engine control unit (ECU) for use in, e.g. an automobile, as illustrated in FIG. 30, there are provided knock sensors 1 and 2 and the like for detecting a knock in addition to various sensors for detecting operational states or parameters of the engine such as cooling water temperature of engine, intake air temperature, throttle opening, etc. In order to perform calculation processings of the output signals from these various sensors by CPU 3, it is necessary to A/D-convert the sensor output signals (analog value) to digital values through the operation of A/D-converters 4 and 5. Each of those various sensors for outputting a voltage signal that corresponds to the operational states of the engine such as cooling water temperature thereof uses a reference voltage of from 0V to 5V in conformity with the operating voltage of the CPU 3, the output voltage therefrom varying within a range of from 0V to 5V. For this reason, the A/D-converter 4 for performing A/D-conversion with respect to such output voltage also uses the same reference voltage (0V–5V per 10 bits) as that of each sensor.

Meanwhile, since each of the knock sensors 1 and 2 is arranged to detect a knock by the use of the amplitude of its output voltage (knock signal), it uses as a reference value ("0" point value) an intermediate voltage of 2.5V of the operating voltage (0V–5V) of the CPU 3. Accordingly, the knock signal that has only necessary knock vibration frequency components taken out by a band pass filter 6 becomes a signal which changes around a voltage of 2.5V. The maximum value (the peak value) of this knock signal is held in a peak-hold circuit (P/H circuit) 7, whereby the occurrence of a knock is determined according to the magnitude of the peak value. Further, the input value of the knock signal that is supplied to the A/D-converter 5 is held by a sample hold circuit (S/H circuit) 8, whereby in units of, for example, 50 μs the output signal from the S/H circuit 8 is A/D-converted and cumulative calculation is performed of the thus A/D-converted value through the operation of the CPU 3. According to the resulting value thus obtained, detection is performed of a malfunction such as wire breakage of the knock sensors 1 and 2.

As mentioned above, in order to detect the knock signal that changes around 2.5V, it is arranged that the upper limit of the output voltage of each of the P/H circuit 7 and S/H circuit 8 is set to be 4.5V and the reference voltage value thereof is set to be 2.5V. Therefore, the A/D-converter 5 for A/D-converting the output voltage of each of these P/H circuit 7 and S/H circuit 8 is constituted by one whose reference voltage ranges from 2.5V to 4.5V (8 bits). By the reference voltages of the both circuits being made to coincide with each other, the output voltages of the P/H circuit 7 and S/H circuit 8 can be A/D-converted with high accuracy without being influenced by the variations of the reference voltages.

In the above-mentioned conventional circuit construction, since the use of the two A/D-converters 4 and 5 is needed due to the difference in reference voltages, for example, between the knock signal and other sensor signals, the circuit construction disadvantageously becomes complex and becomes expensive. As a countermeasure against this, it is been considered to simplify the circuit construction by making these two A/D-converters 4 and 5 common by the use of a single general purpose A/D-converter (0V–5V per 10 bits).

In even this case, while the knock signal has peak held its value at which the difference between itself and the reference voltage of 2.5V becomes maximum, since the A/D-converter uses 0V–5V as the reference voltage, even when the reference value (2.5V) of the knock signal is A/D-converted, the thus converted value does not necessarily become 2.5V which is an intermediate voltage that is determined from the reference voltage of the A/D-converter. In other words, due to the variations or temperature characteristics of circuit elements (resistors, etc.) for generating the reference voltage (2.5V), as illustrated in FIG. 31, an offset occurs between the knock signal reference value and the intermediate voltage of the A/D-converter, with the result that the A/D-converted value of the output knock signal becomes deviated by the extent which corresponds to the offset.

Also, while the output signal from the S/H circuit 8 is A/D-converted in units of, for example, 50 μs and the resulting value is cumulatively calculated by the CPU 3, when the A/D-converters are made common, frequent A/D-conversion processings that are repeatedly executed in units of 50 μs obstruct reliable procurement of time length that is needed for A/D-conversion of other signals.

SUMMARY OF THE INVENTION

The present invention has a first object to remove from an A/D-converted value an offset that occurs thereon due to variations or temperature characteristics of elements constituting a reference voltage generating circuit to thereby determine a correct A/D-converted value, when A/D-converting by the use of a single common A/D-converter output signals for outputting two kinds of signals that differ in reference voltage from each other.

The present invention has a second object to embody this feature of making the A/D-converters common in an engine control unit equipped with knock sensors.

In order to attain these objects, a signal processing circuit of the present invention selects by signal selecting circuit either one of the output signal from a first signal outputting circuit and the output signal from a second signal outputting circuit and A/D-converts the selected signal by a single common A/D-converter. Then, by setting a reference voltage of the A/D-converter to be the same as that (second reference voltage) of the second signal outputting circuit, the output signal from the second signal outputting circuit is A/D-converted with a high precision. Also, a calculation processing circuit A/D-converts with a prescribed timing an offset voltage of the first reference voltage of the first signal outputting circuit and reads in the thus A/D-converted value. Thereafter, using this first reference voltage value, correction is performed of the A/D-converted value of the output signal from the first signal outputting circuit. Accordingly, even when there exists between the reference voltage of the first signal outputting circuit and that of the A/D-converter a deviation that corresponds to the offset voltage resulting from the variations and temperature characteristics of circuit elements, it is possible to remove the offset voltage portion from the A/D-converted value of the output signal from the first signal outputting circuit by performing correction with the use of the first reference voltage, thereby enabling detemination of a correct output signal value.

Preferably, the signal calculating circuit includes a knock detecting circuit for detecting the occurrence of a knock of the internal combustion engine on the basis of a maximum value of the first analog signal that has been held by a peak-hold circuit. As a result of this, the knock signal and another sensor signal which differ in reference voltage from each other can be A/D-converted by a single common A/D-converter.

Preferably, the signal calculating circuit executes diagnosis on the first signal on the basis of the integrated value of the first analog signal that has been held by the integrating circuit. As a result of this, it becomes possible to perform malfunction diagnosis on a side wherein the first signal is input.

BRIEF DESCRIPTION OF THE ACCOMPANYING DRAWINGS

Other objects, features and advantages of the present invention will become more apparent from the following description when read in conjunction with the accompanying drawings, in which:

FIG. 26 is a flow chart illustrating a flow of processes in a gate closing interruption processing in the sixth embodiment;

FIG. 27 is a flow chart illustrating a flow of processes in a "0" point A/D-conversion processing in the sixth embodiment;

FIG. 31 is a waveform diagram illustrating the relationship between an A/D-converted reference value and an offset from a knock signal reference value ("0" point).

Figure 1:
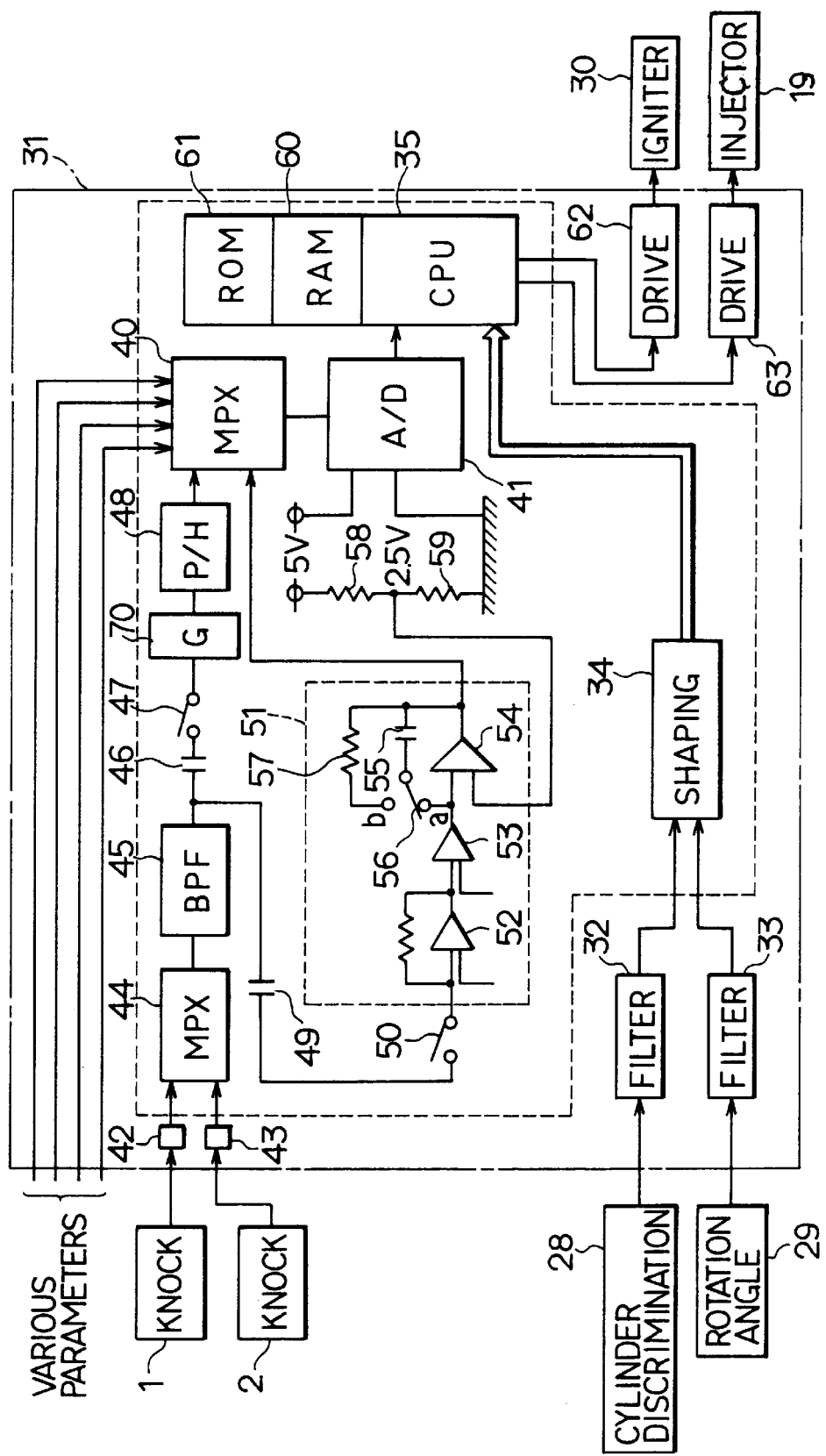
FIG. 1 is a circuit diagram illustrating the construction of an entire engine control unit in a first embodiment of the present invention.
Figure 2:
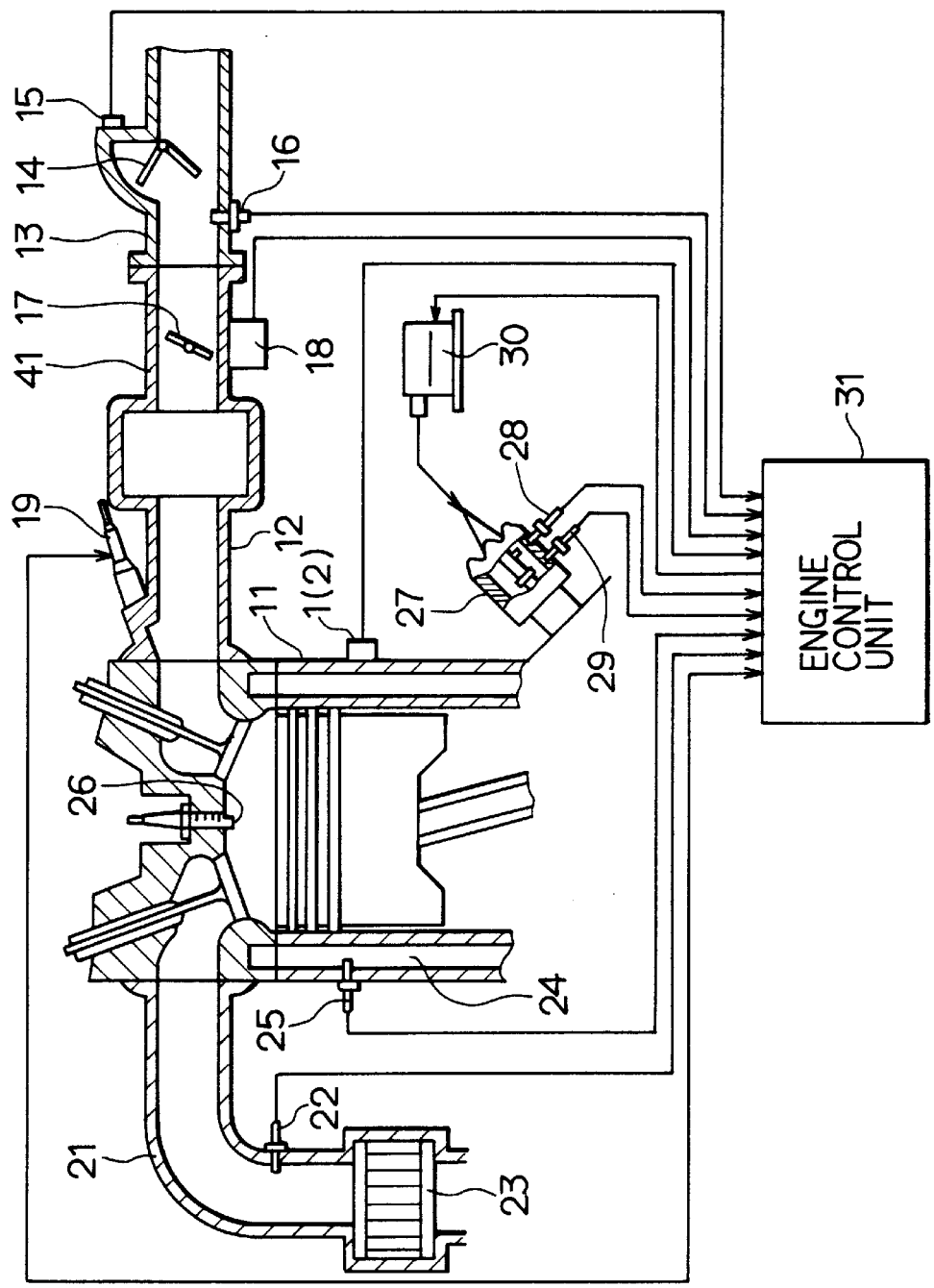
FIG. 2 is a schematic view illustrating a construction of the entire engine control system.

DETAILED DESCRIPTION OF THE PRESENTLY PREFERRED EMBODIMENTS (First Embodiment)

A first embodiment wherein the present invention is applied to an engine control unit will now be described with reference to FIGS. 1 to 9. First, a schematic construction of an entire engine control system will be explained with reference to FIG. 2. On an upstream side of an intake pipe 13 of an engine 11 which is an internal combustion engine there is provided an air-flow meter 14. The amount of intake air that is measured using this air-flow meter 14 is converted by a potentiometer 15 to a voltage signal which in turn is output therefrom. Also, on a downstream side of the air-flow meter 14 there are provided an intake air temperature sensor 16 for detecting the temperature of the intake air, a throttle valve 17 and a throttle sensor 18 for detecting the opening of this throttle valve 17. Also, an injector 19 is provided on an intake manifold 12 for introducing the intake air having passed through the throttle valve 17 into each air cylinder.

Meanwhile, on an exhaust pipe 21 of the engine 11 there are provided an oxygen sensor 22 for detecting the concentration of residual oxygen in the exhaust gas and a three-way catalyst 23 for purifying the exhaust gas. Also, on a water jacket 24 for cooling the engine 11 there is mounted a water temperature sensor 25 which detects the temperature of cooling water. Also, on a distributor 27 for distributing a high voltage current to an ignition plug 26 for each cylinder of the engine 11 there are provided an cylinder discrimination sensor 28 for discriminating a crank angle reference position of a specified cylinder and a rotation angle sensor 29 for outputting a pulse signal having a frequency that corresponds to the number of engine rotations. A high voltage secondary current control signal is supplied from the igniter to the distributor 30.

Figure 3:
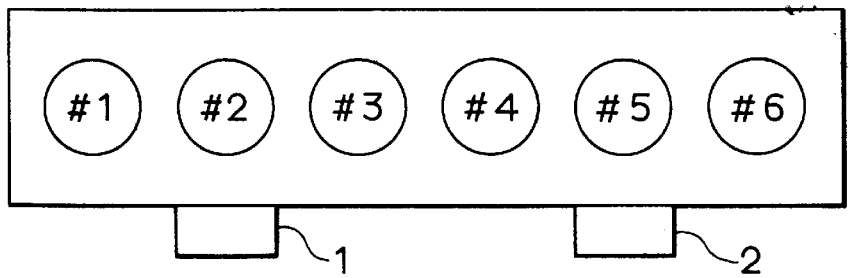
FIG. 3 is a view illustrating mounting positions of two knock sensors.

In this embodiment, the engine 11 is constituted by an in-line 6-cylinder engine, whose cylinder block is provided with two knock sensors 1 and 2 for detecting knocks. As illustrated in FIG. 3, one knock sensor 1 detects a knock that occurs on a first cylinder (#1) to a third cylinder (#3) and the other knock sensor 2 detects a knock that occurs on a fourth cylinder (#4) to a sixth cylinder (#6). Since ignition is performed in the order of #1-#5-#3-#6-#2-#4-#1 - - - , the output signals of the two knock sensors 1 and 2 are alternately changed over, whereby a knock on each cylinder is detected.

The construction of an engine control unit 31 for receiving signals from the above-mentioned various sensors to thereby perform the engine control will now be explained with reference to FIG. 1. The pulse signals that are output from the cylinder discrimination sensor 28 and rotation angle sensor 29 are supplied through filters 32 and 33, respectively, to a waveform shaping circuit 34 in which they are waveform shaped and the resulting pulse signals are supplied to a CPU 35 which performs calculation processing. An output circuit (not illustrated) for various sensors detecting various parameters (operational states) of the engine, such as the water temperature sensor 25, intake air temperature sensor 16, air-flow meter 14, throttle sensor 18, etc. produce output signals (that corresponds to second signals) from this output circuit is input through a multiplexer 40 which selects to an A/D-converter 41 in which this output signal is subjected to A/D-conversion, and the resulting signal is supplied to the CPU 35. The output circuit for snesors is made to have a reference voltage of from 0V to 5V in conformity with the operating voltage of the CPU 35 and as a result the output voltage therefrom varies within a range of from 0V to 5V. In conformity with this, a 10-bit A/D-converter 41 is also made to have a reference voltage of from 0V to 5V as in the case of the voltage of the sensor output circuit.

Meanwhile, since the knock sensors 1 and 2 are arranged to indicate a knock by an amplitude of their output voltage (knock signal), they are made to use as a reference point ("0" point) an intermediate voltage of 2.5V of the operating voltage (0V–5V) of the CPU 35. The output signals (knock signals) of the knock sensors 1 and 2 are filtering processed by CR filters 42 and 43, whereby their noises are removed and they are adjusted so that their peak level may become 5V or less. The two knock signals that have been fitering processed by the CR filters 42 and 43 are alternately selected by a multiplexer 44 in the order of ignition and the thus selected signal has only its necessary knock vibration frequency components alone taken out by means of a band pass filter 45.

With the output side of this band pass filter 45 there are connected in series a coupling capacitor 46, a switch 47, a gain circuit 70 and a peak-hold circuit (hereinafter referred to as "P/H circuit") 48. The peak value of the knock signal which has its peak held (P/H) by this peak-hold circuit is input through the multiplexer 40 to the A/D-converter 41 in which the peak value is subjected to A/D-conversion, and the resulting value signal is supplied to the CPU 35. It is to be noted here that the peak value of the knock signal is detected during an open gate period which is a knock determination period that immediately succeeds the ignition and this peak value is compared with a prescribed knock determination period to thereby make a determination on the occurrence of a knock.

Also, an integrating circuit 51 is connected in series with the output side of the band pass filter 45 through a coupling capacitor 49 and a switch 50. This integrating circuit 51 is constituted by a plurality of operational amplifiers 52 to 54. Half-wave rectification and amplification of a knock signal are performed by the preceding two operational amplifiers 52 and 53 and charging of the electric charge thereof into a capacitor 55 is performed by the succeeding operational amplifier 54 to thereby perform integration of the knock signal. A switch 56 is provided in a charging circuit for charging this capacitor 55. By changing over this switch 56 to a discharging side (b side), the electric charge that has been charged in the capacitor 55 is discharged through a resistor 57 to thereby reset the integrating circuit 51. A voltage of 2.5V that is prepared by bisecting a power source voltage of 5V by the use of two resistors 58 and 59 having the same resistance value is input as a reference point ("0" point, hereinafter) of integration is input to the integrating operational amplifier 54. The integrated value (the charged voltage of the capacitor 55) of the knock signal that is output from this integrating circuit 51 is input through the multiplexer 40 to the A/D-converter 41 in which this integrated value is A/D-converted, and the resulting integrated value signal is supplied to the CPU 35.

The CPU 35 temporarily stores in a RAM 60 various input data items it has taken in through the A/D-converter 41 and, on the basis of these input data items, calculates an ignition timing and a quantity of fuel to be injected according to an engine control program that is stored in a ROM 61 and outputs the calculated results to drive circuits 62 and 63, thereby controlling the operations of the ignitor 30 and injector 19, thereby controlling the operation of the engine 11. Further, according to respective routines illustrated in FIGS. 4 to 8, the CPU 35 makes knock determination on the basis of an output signal from the P/H circuit 48 (the peak value of the knock signal) and also makes a determination on an accidental trouble (malfunction) such as wire breakage of the knock sensors 1 and 2 on the basis of an output signal from the integrating circuit 51 (the integrated value of the knock signal). The contents of the processes that are executed in the respective routines illustrated in FIGS. 4 to 8 will now be explained in detail.

Figure 4:
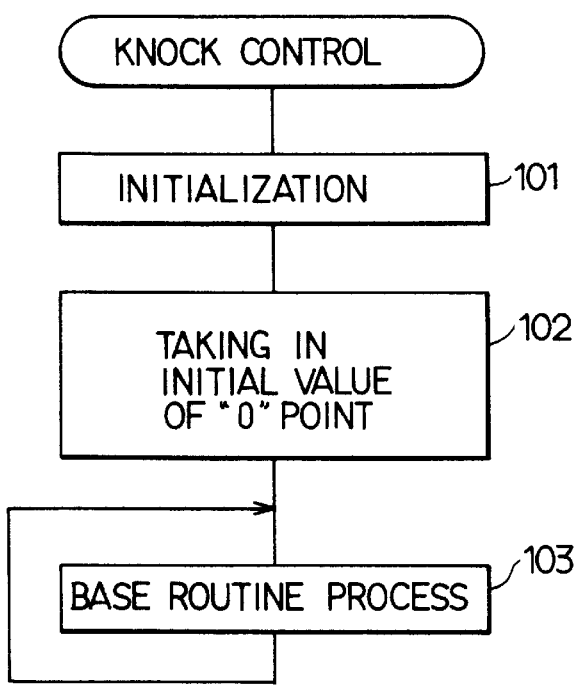
FIG. 4 is a flow chart illustrating a flow of processes in a knock control program in the first embodiment.

When resetting of the CPU 35 is released after closure of a power source with respect to the engine control unit 31, the knock control program illustrated in FIG. 4 is started. In this knock control program, first, in step 101, initial processings such as initialization of the RAM 60, initialization of the interruptions and timers, setting of initial values of various data, etc. are executed. Thereafter, in step 102, taking-in is performed of an initial value of the "0" point that is obtained as a result of integration thereof in the integrating circuit 51. This taking-in of the "0" point is performed by changing over the integration execution switch 56 to an integrating side ((a) side) with the switch 50 on an input side of the integrating circuit 51 being made kept "off", then integrating by the capacitor 55 the reference voltage (2.5V) that is given by the resistors 58 and 59 and handled as the "0" point and then A/D-converting the resulting integrated voltage through the operation of the A/D-converter 41. Thereafter, in step 103, a base routine processing for executing processings such as clear of a stack area inside the RAM 60 for temporarily storing calculation data or input data during execution of the program is repeatedly executed as a loop.

Figure 5:
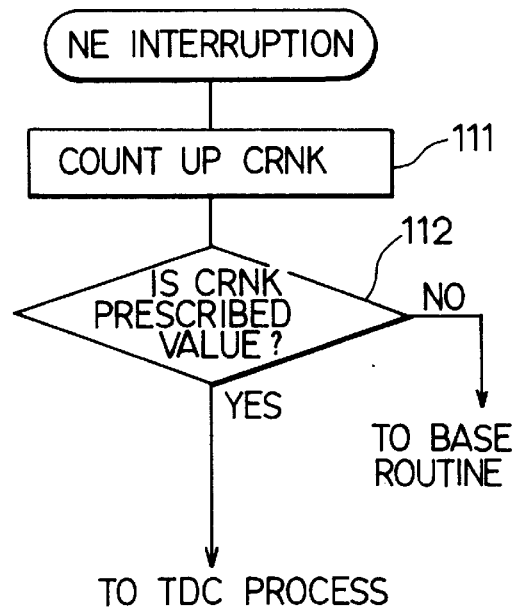
FIG. 5 is a flow chart illustrating a flow of processes in an Ne interruption processing in the first embodiment.

During execution of this base routine processing, an NE interruption occurs in units of, for example, 30° C. A, thus an NE interruption processing illustrated in FIG. 5 is executed. In this NE interruption processing, first, in step 111, a counter CRNK for discriminating an ignited cylinder is made to count up by a value of "1". At this time, since there may be a case where the counted value of the counter CRNK is deviated from a proper value due to, for example, noises, there may be also a case where the counted value of the counter CRNK is corrected with the use of, for example, a cylinder signal (TDC: top dead center) as described later. In an in-line 6-cylinder engine, the counter CRNK can be made to count up from 0 to 23 and, when it arrives at a value of 24, the counted value thereof is cleared.

Then, in the next step 112, it is determined whether or not the counted value of the counter CRNK is a prescribed value (any one of 0, 4, 8, 12, 16 and 20 in the case of the 6-cylinder engine). If this counted value is not the prescribed value, the operation returns to the base routine whereas if that counted value is the prescribed value, the processing operation proceeds to a TDC processing illustrated in FIG. 6 (step 120).

In this TDC processing routine 120, first, in step 121, the value of the cylinder signal (TDC) is updated by the counted value of the counter CRNK according to the next table 1.

TABLE 1

In the case of in-line 6-cylinder engine

| CRNK     | 0  | 4  | 8  | 12 | 16 | 20 |
|----------|----|----|----|----|----|----|
| Cylinder | #1 | #5 | #3 | #6 | #2 | #4 |

Note: In the above table 1, '#' represents the first cylinder (hereinafter, the same applies).

Then, in the next step 122, it is determined whether or not a gate closure processing as described later is ended. If the gate closure processing is ended, the operation jumps over to step 124. However, if the gate closure processing is not ended, the operation proceeds to step 123 in which resetting of the P/H circuit 48 and resetting of the integrating circuit 51 (change-over of the switch 56 to the discharging side (b)), i.e. minimum necessary processings for the gate closure processing are executed, the operation proceeding to step 124.

In this step 124, the gate open timing which is the knock signal peak-hold and integration start timing is calculated and set. In the next step 125, the knock sensors 1 and 2 are changed over from one to the other by the cylinder signal whose value was updated in the step 121. For example, in a case where the present ignited cylinder is #1, #2 or #3, change-over to the knock sensor 1 is performed. On the other hand, in a case where the present ignited cylinder is #4, #5 or #6, change-over to the knock sensor 2 is performed. Then, in the next step 126, preparations for the next peak-hold and integration, such as setting of the gains, are performed, the operation returning to the base routine processing.

Figure 6:
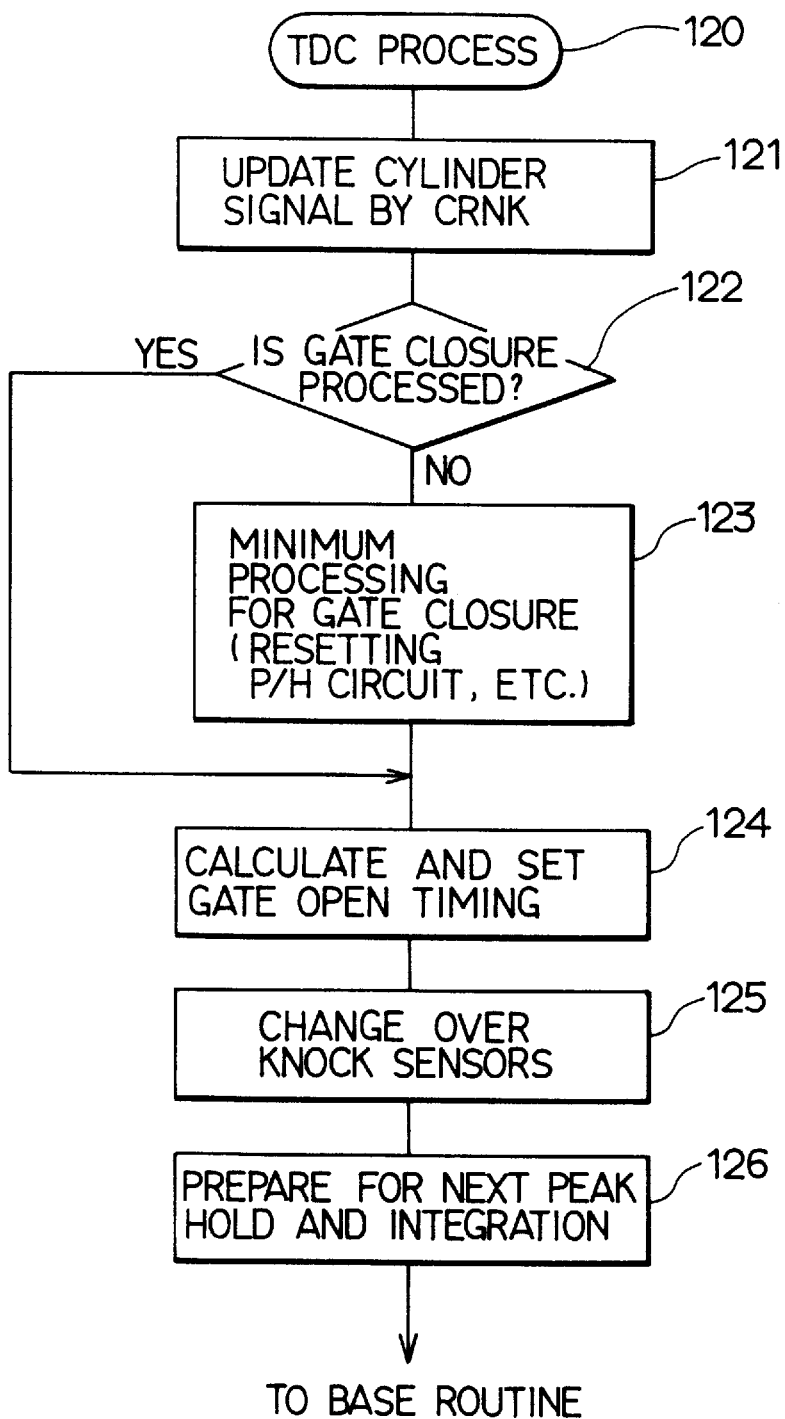
FIG. 6 is a flow chart illustrating a flow of processes in a TDC processing in the first embodiment.
Figure 7:
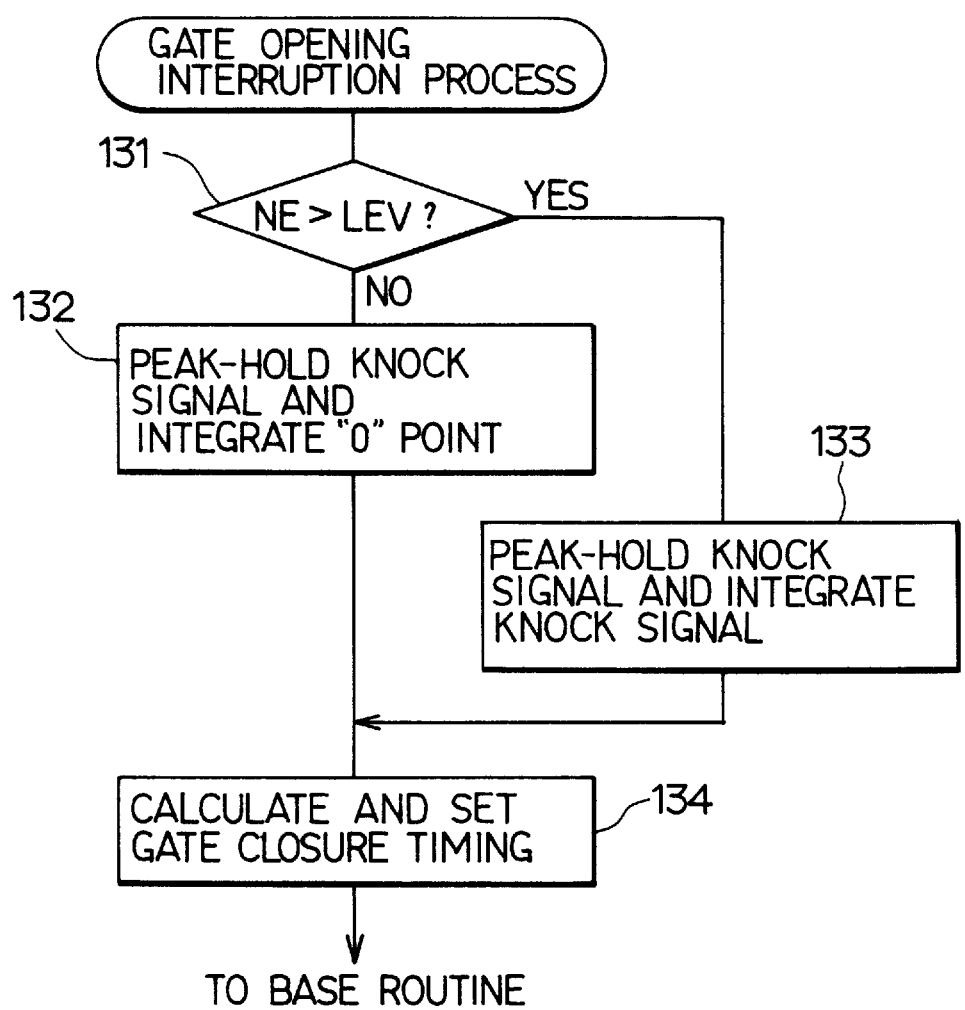
FIG. 7 is a flow chart illustrating a flow of processes in a gate opening interruption processing in the first embodiment.

Meanwhile, a gate opening interruption processing routine illustrated in FIG. 7 is started with the gate open timing that is calculated and set in step 124 in FIG. 6. In this gate opening interruption processing routine, first, in step 131, it is determined whether or not the number NE of engine rotations exceeds a prescribed number LEV of engine rotations. It is to be noted here that the prescribed number LEV of rotations is a failure (malfunction)-determining critical number of rotations for performing detection (determination) of, for example, wire breakage (failure (malfunction)) of the engine, which is set to, for example, 1000 rpm in a range having a smaller effect on the ignition control of the engine. In this embodiment, taking-in is performed of an offset voltage that is offset from the "0" point and that is output from the integrating circuit 51, by utilizing this range of low rotation wherein the number of rotations is smaller than the failure (malfunction) determining critical number LEV of rotations.

That is, in step 131, when NE≦LEV, the operation proceeds to step 132 in which peak-hold (P/H) operation on a knock signal is started by the P/H circuit 48 and integration operation on the "0" point is started by the integrating circuit 51 (at this time, the switch 50 on the input side of the integrating circuit 51 is maintained in an "off" state). In the next step 134, the gate closure timing which is the knock signal peak-hold (P/H) and "0" point integration end timing is calculated and set, the operation returning to the base routine processing.

On the other hand, when NE>LEV, since this range is that wherein malfunction determination is performed, the operation proceeds to step 133 in which peak-hold (P/H) operation on a knock signal is started by the P/H circuit 48 and, with the switch 50 on the input side of the integrating circuit 51 being kept "on", integration operation thereon for making a malfunction determination is started by the integrating circuit 51. In a subsequent step 134, the gate closure timing is calculated and set, whereby the operation returns to the base routine processing.

Figure 8:
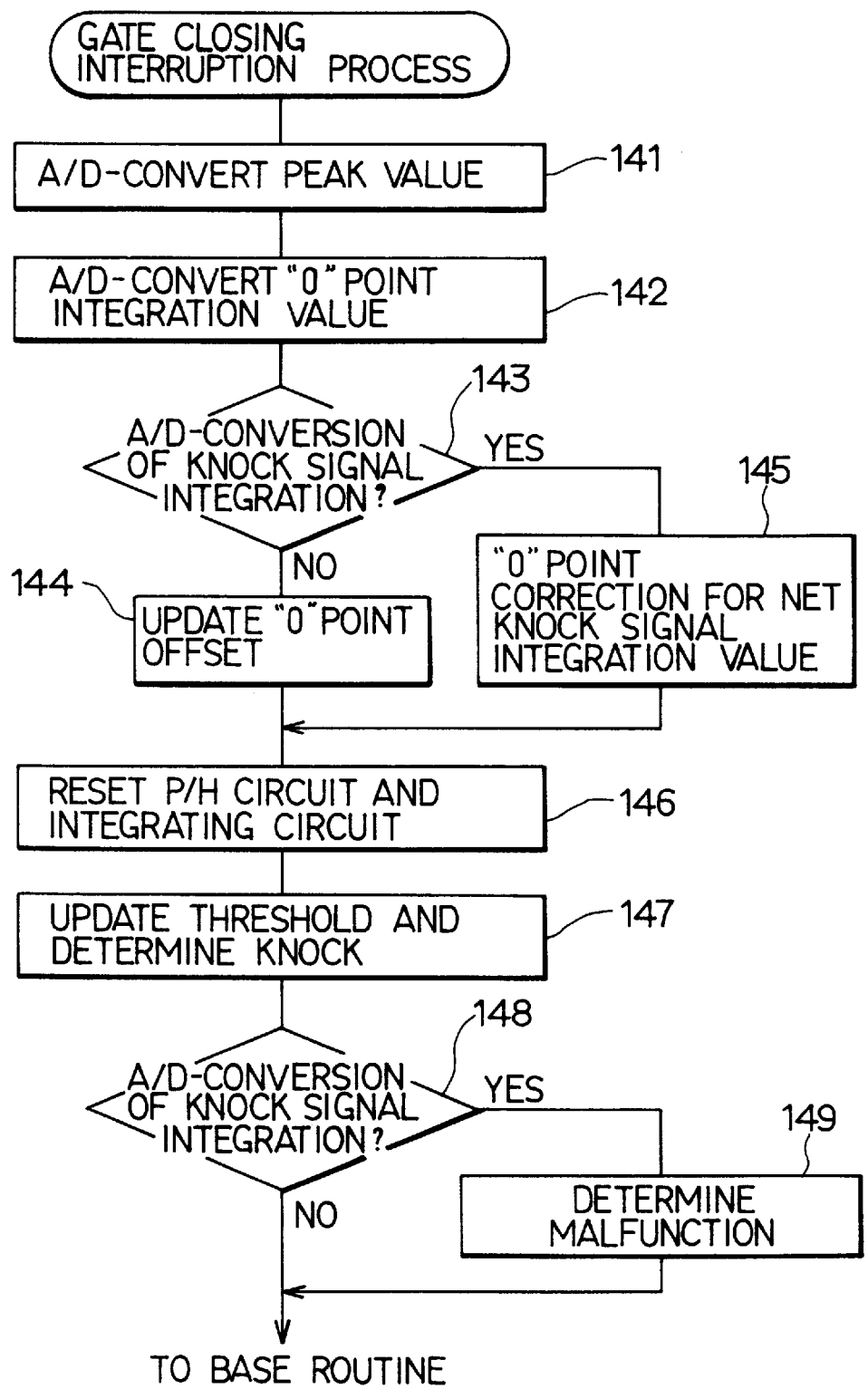
FIG. 8 is a flow chart illustrating a flow of processes in a gate closing interruption processing in the first embodiment.

Meanwhile, a gate closing interruption processing routine illustrated in FIG. 8 is started with the gate closure timing that is calculated and set in step 134 in FIG. 7. In this gate closing interruption processing routine, first, in step 141, an output signal (a peak value of the knock signal) from the P/H circuit 48 is A/D-converted by the A/D-converter 41 and the thus converted signal is taken into the CPU 35. In a subsequent step 142, an output signal (an integrated value of the "0" point knock signal) from the integrating circuit 51 is A/D-converted by the A/D-converter 41 and the thus converted signal is taken into the CPU 35. Thereafter, in step 143, whether or not the integrated value of the knock signal has been A/D-converted, namely whether the A/D-converted value of the integration output signal from the integrating circuit 51 is an integrated value of the knock signal (obtained through execution of step 133 in FIG. 7) or an integrated value of the "0" point (obtained through execution of step 132 in FIG. 7) is determined. If this A/D-converted value is an integrated value of the "0" point, the operation proceeds to step 144 in which the previous "0" point offset voltage, stored in the RAM 60, is updated by the present "0" point offset voltage. In contrast, if the A/D-converted value is an integrated value of the knock signal, the operation proceeds to step 145 in which the "0" point A/D-converted value, which is an offset value stored in the RAM 60, is subtracted from the A/D-converted value of the present knock signal integrated value to thereby determine a net integrated value, thus performing "0" point correction.

After "0" point updating and "0" point correction have been performed as mentioned above, the operation proceeds to step 146 in which both the P/H circuit 48 and the integrating circuit 51 are reset. Thereafter, in step 147, a knock-determining threshold value is updated in correspondence with a mean value (background) of the knock signals, whereby determination on the occurrence of a knock is made by comparing a peak value of the knock signal with this knock-determining threshold value and the determination result is output. Then, in the next step 148, as in the case of the step 143, it is determined whether or not an integrated value of the knock signal has been A/D-converted. When the result of this determination is "YES", the integrated value of the knock signal that was "0" point corrected in the step 145 is compared with the malfunction-determining threshold value to thereby make a determination on a malfunction (accidental trouble such as wire breakage) of each relevant one of the knock sensors 1 and 2. Then, the result of this determination is output, the operation returning to the base routine processing. In contrast, when the processing in step 148 determines "NO", that is, when "0" point updating is performed in step 144, since no integrated value of the knock signal is presently obtained, the operation returns to the base routine processing with no malfunction determination being performed.

Figure 9:
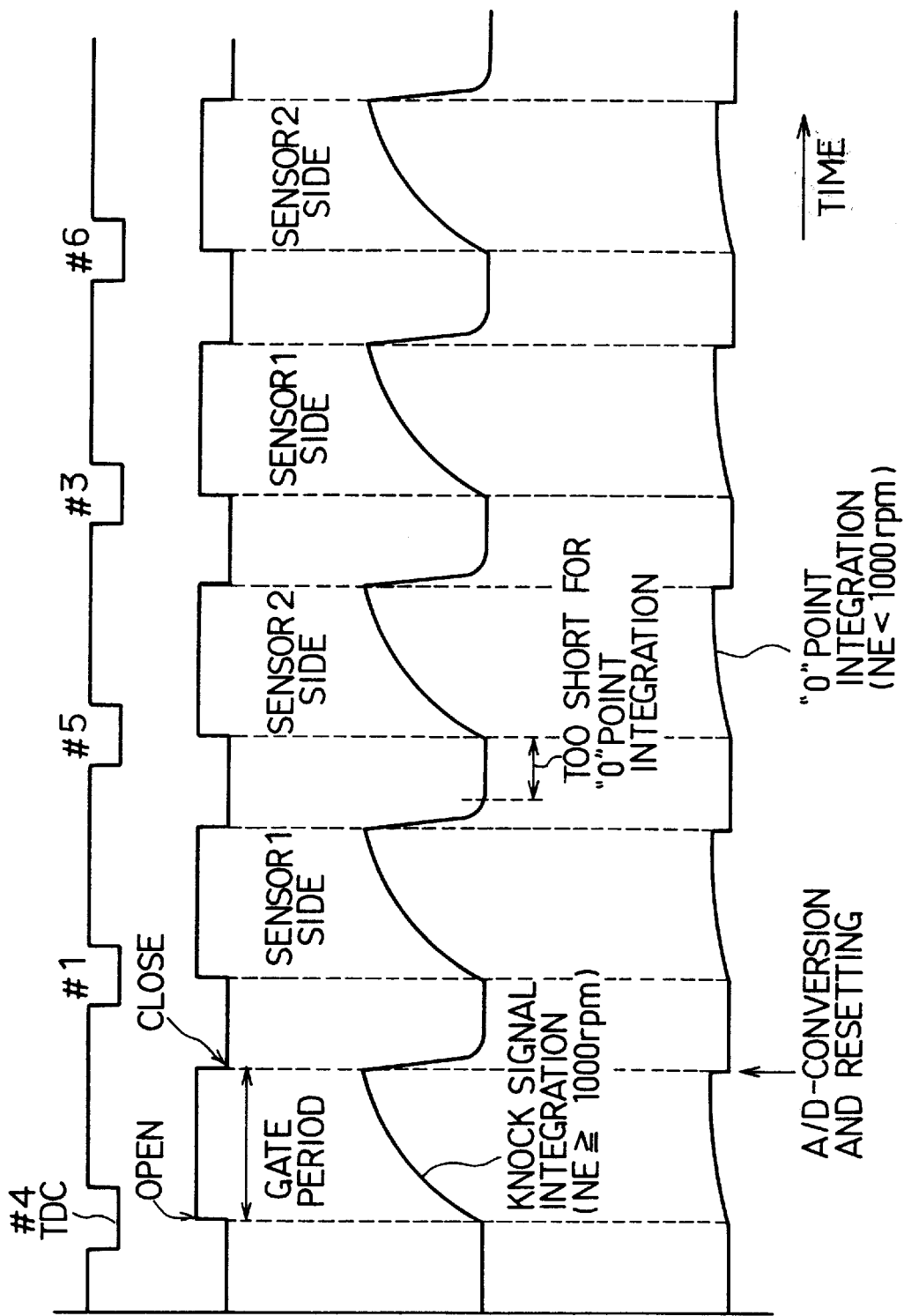
FIG. 9 is a time chart illustrating the operation of an integrating circuit in the first embodiment.

The operation of the integrating circuit 51 when performing malfunction detection by executing the above-explained processings will now be explained according to a time chart illustrated in FIG. 9. A gate opening period is set at every TDC and the knock sensors 1 and 2 are alternately changed over in correspondence with the ignited cylinders. In a range of 1000 rpm or more in which determination on a malfunction is executed, a knock signal is integrated within the gate open period. Then, at the gate closing time, the integrated value of the knock signal is A/D-converted and thereby "0" point corrected while, on the other hand, the integrating circuit 51 is reset. On the other hand, in a range of engine rotations number of less than 1000 rpm, since the amplitude of knocking vibrations is small with the result that no malfunction determination is executed, within the gate open period "0" point integration is performed and updating is performed of the "0" point value that is stored in the RAM 60. It is to be noted that although it can be considered for the "0" point integration to be performed during a time period of from the end of resetting of the integrating circuit 51 to the start of a next gate open period, this time period is short compared to the gate open period and therefore a sufficient amount of integrating time is impossible to ensure.

In the above-explained first embodiment, the A/D-converters 41 used with respect to a knock signal having a reference voltage and another sensor signal having a reference voltage that may be different therefrom are made common. Whereby, even when the reference voltage of the integrated value of the knock signal is being different from the A/D-converted reference voltage of the A/D-converter 41, since the A/D-converted value of the knock signal integrated value is "0" point corrected, it is possible to remove therefrom an amount of "0" point offset that occurs due to variations and temperature characteristics of the resistors 58 and 59 for generating the reference voltage (2.5V). As a result, it is possible to perform malfunction determination accurately.

Further, since knock signal integration and "0" point integration are performed using the gate open period that is set longer for the purpose of performing knock determination, it is possible to ensure a sufficient amount of integrating time (larger than that which corresponds to a time constant for charging the capacitor 55). This enables realization of the enhancement of the malfunction determination precision as well as the enhancement of the "0" point correction precision. In addition, since performing the "0" point integration by using the gate open period, there is no need to set a new timing for taking-in of the "0" point data, whereby the relevant processing becomes easy to execute.

(Second Embodiment)

Mere taking-in of the "0" point data during a low rotation period in the above-mentioned embodiment may be accompanied by the following inconvenience. That is, when a relevant vehicle continuously travels in a range of high rotation, such as when it travels on a turnpike road, there may be a case where the stored values of the RAM 60 for storing the "0" point data are damaged due to noises or the like with the result that determination error is made on a malfunction.

Figure 10:
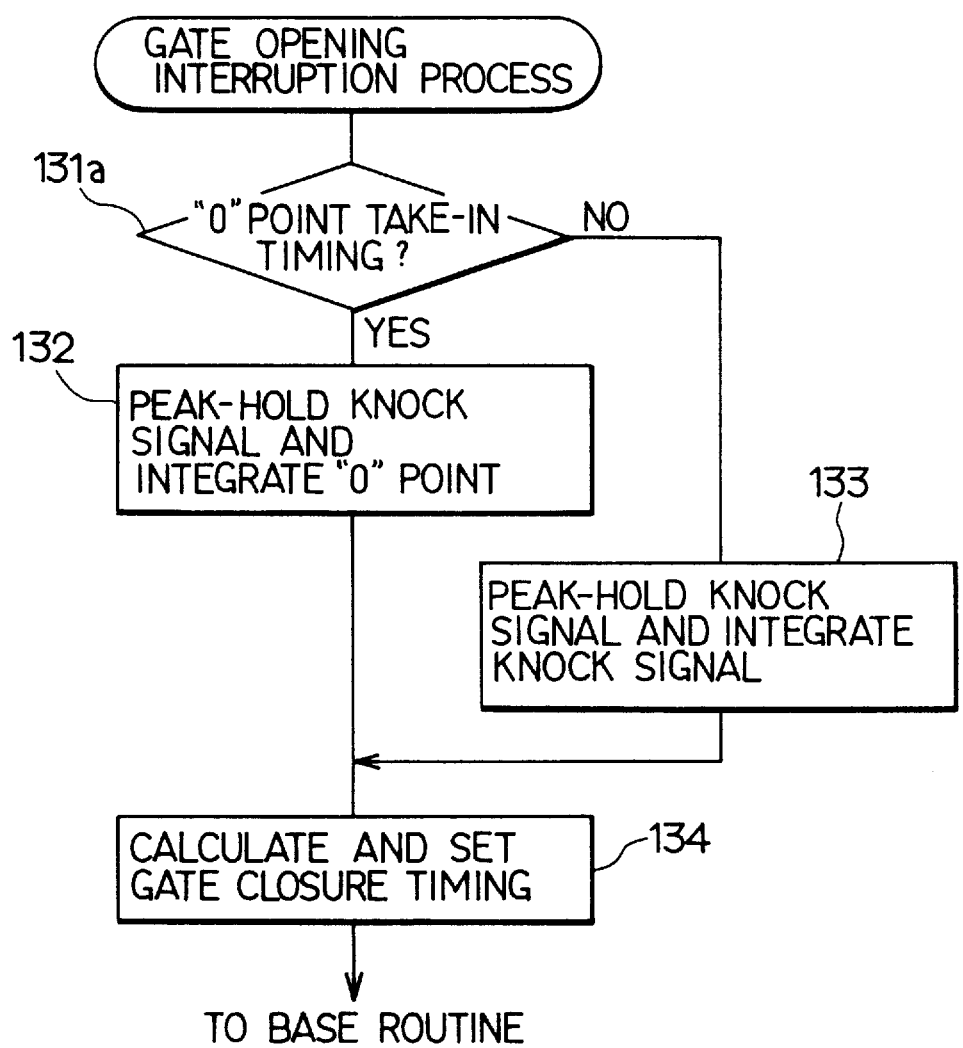
FIG. 10 is a flow chart illustrating a flow of processes in a gate opening interruption processing in a second embodiment of the present invention.
Figure 11:
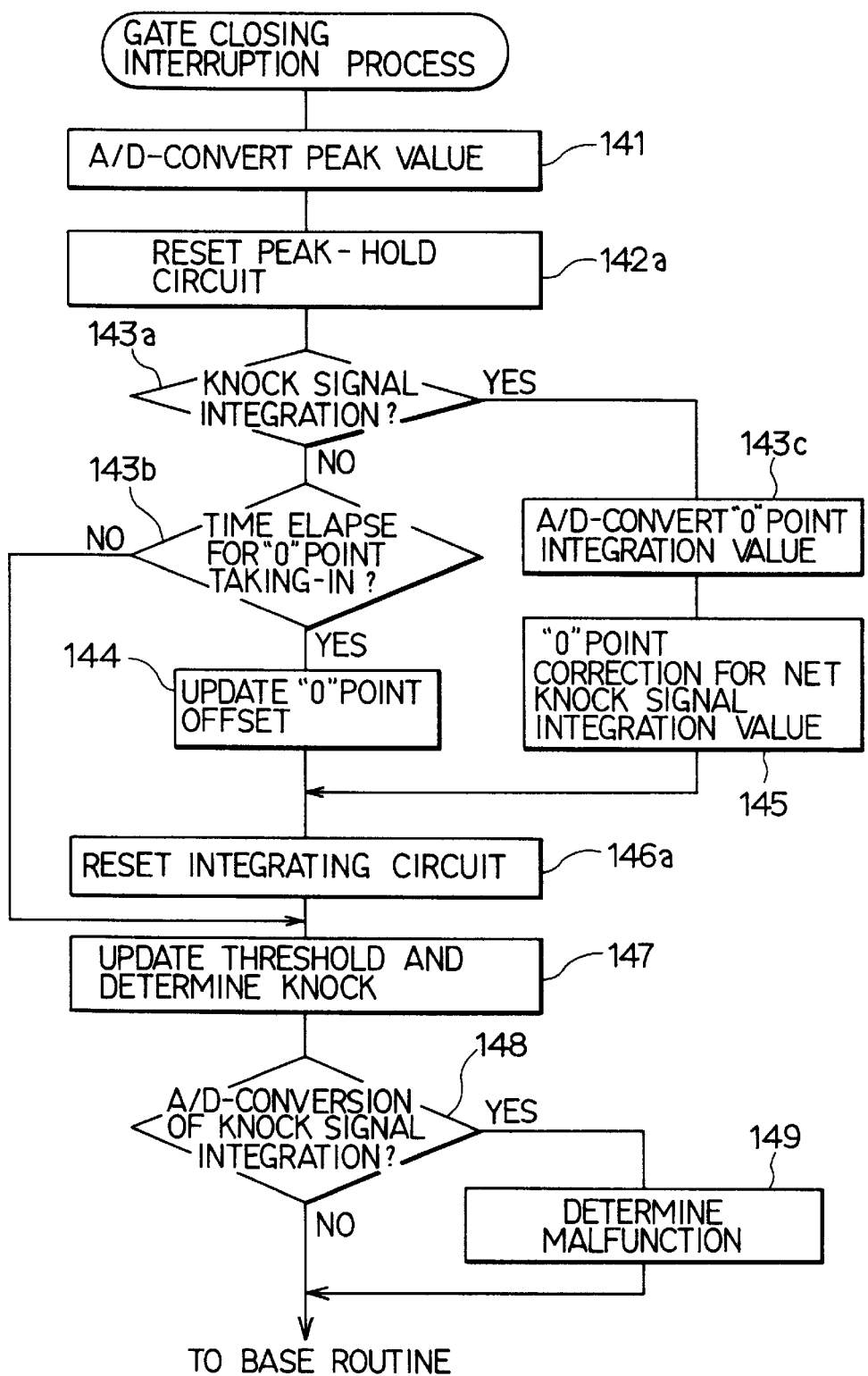
FIG. 11 is a flow chart illustrating a flow of processes in a gate closing interruption processing in the second embodiment.
Figure 12:
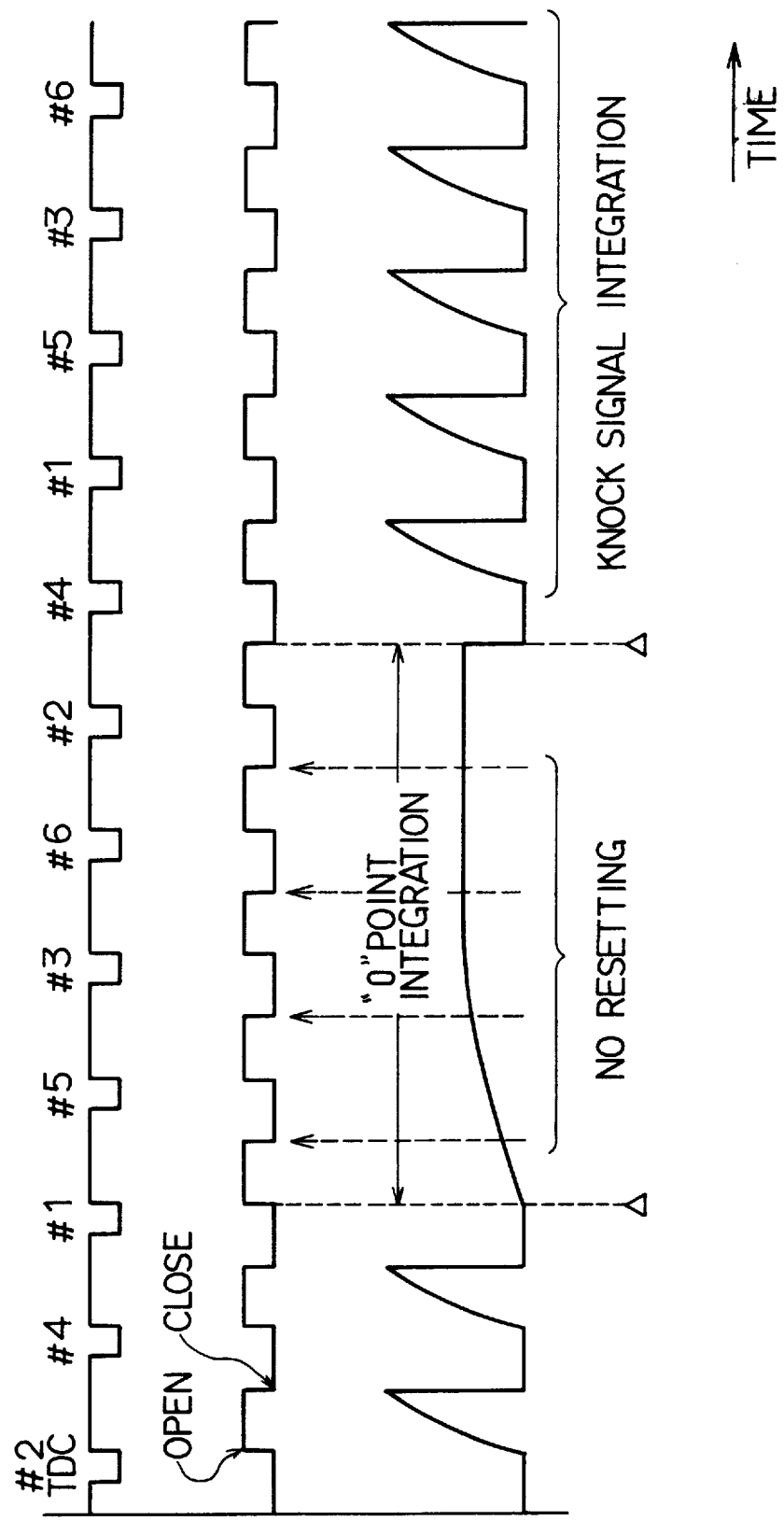
FIG. 12 is a time chart illustrating the operation of an integrating circuit in the second embodiment.

As a countermeasure against this, in a second embodiment of the present invention that is illustrated in FIGS. 10 to 12, in order to perform "0" point detection and "0" point correction in even a range of high rotation, "0" point integration of the integrating circuit 51 is continuously performed over a plurality of consecutive gate open periods in units of a prescribed number of ignition times or a prescribed time period until a prescribed amount of integrating time (larger than that which corresponds to a time constant for charging the capacitor 55) has elapsed and, during such consecutive gate open periods, it is arranged to perform no knock signal integration. An explanation will now be given of the processings in FIGS. 10 and 11 that differ from those in the first embodiment.

The gate opening interruption processing routine of FIG. 10 is modified from that of FIG. 7 in such a way that the step 131 in FIG. 7 is changed to step 131a. The remaining steps in FIG. 10 are the same as those in FIG. 7. That is, in the gate opening interruption processing in FIG. 10, first, in step 131a, it is determined whether or not the present point in time is a timing for taking-in of "0" point data from the integrating circuit 51. It is determined whether or not a prescribed number of ignition times or a prescribed time period has elapsed from taking-in of previous "0" point data. If this prescribed time period has not yet elapsed, it is determined that the present point in time is not a timing for taking-in of "0" point data. Then, the operation proceeds to step 133 in which knock signal peak-hold (P/H) and knock signal integration are started and, in a subsequent step 134, a gate closure timing is calculated and set, the operation returning to the base routine processing.

If the prescribed number of ignition times or prescribed number of time period has elapsed from taking-in of the previous "0" point data, it is determined that the present point in time is a timing for taking-in of the "0" point data, the operation proceeding to step 132 in which peak-hold of the knock signal as well as integration of the "0" point data of the integrating circuit 51 is started. Then in a subsequent step 134, a gate closure timing is calculated and set, the operation then returning to the base routine processing.

Meanwhile, the gate closing interruption processing routine illustrated in FIG. 11 is started with the gate closure timing that is calculated and set in step 134 in FIG. 10. In this gate closing interruption processing routine, first, in step 141, an output signal (knock signal peak value) from the P/H circuit 48 is A/D-converted by the A/D-converter 41 and the thus convreted signal is taken into the CPU 35. Then, in the next step 142a, the P/H circuit 48 is reset. Thereafter, in step 143a, it is determined whether or not knock signal integration is performed. If the result of this determination is "NO", that is, if "0" point integration is performed, the operation proceeds to step 143b in which it is determined whether or not an amount of integrating time needed for taking-in of "0"

point data (larger than that which corresponds to a time constant for charging the capacitor 55) has elapsed. If this amount of integrating time has not yet elapsed, the "0" point integration continues to be performed, the operation then proceeding to step 147. The processings that are to be executed thereafter are the same as those in FIG. 8 in the first embodiment.

Thereafter, in step 143b, if it has been determined that the amount of integrating time needed for taking-in of the "0" point data has elapsed, the operation proceeds to step 144 in which the previous "0" point data that is stored in the RAM 60 is updated by the present "0" point data. Then, the operation proceeds to step 146a in which the integrating circuit 51 is reset to thereby finish the "0" point integration, the operation then proceeding to step 147.

Also, in the step 143a, if it has been determined that knock signal integration is performed, the operation proceeds to step 143c in which an integrated value of the knock signal is A/D-converted and supplied to the CPU 35. In a subsequent step 145, the "0" point A/D-converted value which is an offset voltage that is stored in the RAM 60 is subtracted from the present knock signal integrated value A/D-converted value to thereby determine a net integrated value, thereby performing "0" point correction. Thereafter, in step 146a, the integrating circuit 51 is reset to thereby finish "0" point integration, the operation then proceeding to step 147. The processings that are to be executed thereafter are the same as those in FIG. 8 in the first embodiment.

The operation of the integrating circuit 51 when performing malfunction detection through execution of the above-explained processings will now be explained with reference to a time chart illustrated in FIG. 12. A gate open period is set in units of TDC and, during each gate open period, knock signal integration is performed from a time when the previous "0" point data was taken in to a time when a prescribed number of ignition times or a prescribed time period elapses. Then, at the gate closing time, the knock signal integrated value is A/D-converted to thereby perform "0" point correction. Then, when a prescribed number of ignition times or a prescribed time period elapses from taking-in of the previous "0" point data, "0" point integration is started simultaneously with a time when the gate has been opened. Thus, this "0" point integration is continuously performed over a plurality of consecutive gate open periods until a prescribed amount of integrating time (larger than that which corresponds to a time constant for charging the capacitor 55) has elapsed and, during such consecutive gate open periods, A/D-conversion and resetting of the integrating circuit 51 are not performed. Then, upon lapse of a prescribed amount of integrating time, at the gate closing time, the integrated value of the "0" point data is A/D-converted, whereby the previous "0" point data is updated. On the other hand, the integrating circuit 51 is reset.

In this case, the number of the gate open periods (the number of times in which no malfunction detection is performed) in the "0" point integration time period differs depending on the number of engine rotations. Therefore, in a range of low rotation wherein the length of the gate open period becomes long, since a sufficient amount of integrating time can be ensured within a single gate open period, there may be also a case where "0" point integration is finished within a single gate open period as in the first embodiment.

It is to be noted here that although taking-in of the "0" point data may be performed in units of either a prescribed number of ignition times or a prescribed time period, in a case where this taking-in is performed in units of a prescribed number of ignition times, the time interval for taking-in of the "0" point data varies depending on the number of engine rotations. On the other hand, in a case where taking-in of the "0" point data is performed in units of a prescribed time period, since the time interval therefor does not depend on the number of engine rotations, even when data destruction in the RAM, etc. have occurred, it is possible to restore to the "0" point data take-in operation always with the same timing.

In the above-explained second embodiment, since it is arranged to perform "0" point integration continuously over a plurality of gate open periods until a prescribed amount of integration time (larger than that which corresponds to a time constant for charging the capacitor 55) elapses, during even a high rotation time period wherein each gate open period becomes shorter it is possible to perform "0" point integration by the use of a sufficient amount of time. Thus, it becomes possible to update the "0" point data over an entire range of all rotations. Accordingly, when a relevant vehicle travels continuously in a range of high rotations, such as when traveling on a turnpike road, even if the stored values in the RAM 60 for storing "0" point data have been destroyed due to noises or the like, it is possible to update the "0" point data into correct values during high-speed travel and thus prevent the occurrence of error in the malfunction determination.

Figure 13:
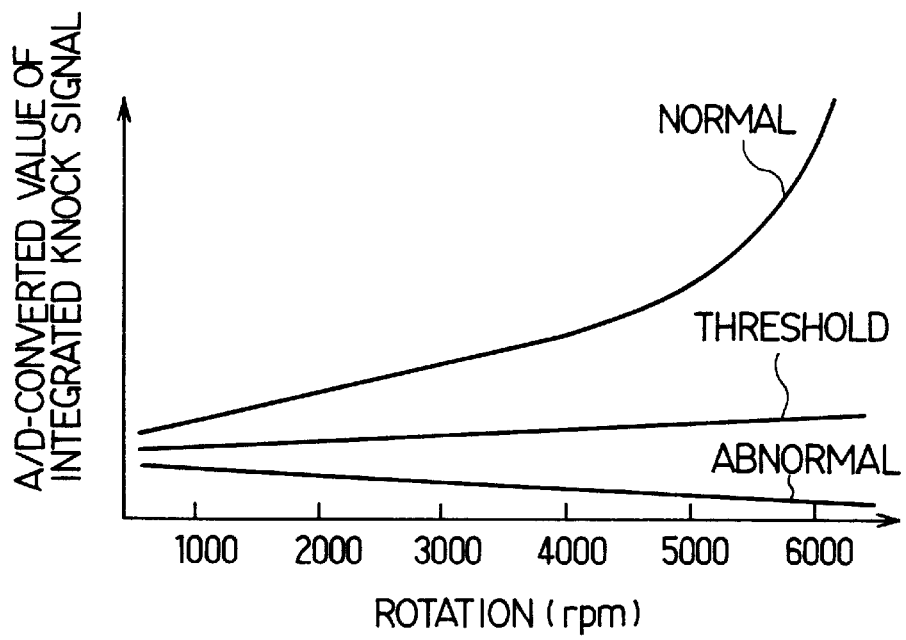
FIG. 13 is a characterisitic diagram illustrating the relationship between A/D-converted values of the knock signal integrated values and the number of engine rotations in cases where the knock sensors are normal and abnormal.

Meanwhile, FIG. 13 illustrates the relationship between A/D-converted value of integrated knock signal and the number of rotations in cases where each of the knock sensors 1 and 2 is normal and abnormal. In a range of low rotation wherein a knock signal is small, since the difference in A/D-converted value between when the relevant knock sensor is normal and when this sensor is abnormal becomes small, the deviation (offset) that occurs on the "0" point value greatly affects the determination on a malfunction and it is sometimes likely that the malfunction determination precision becomes resultantly decreased. For this reason, the necessity of performing "0" point correction increases.

Also, although as the number of engine rotations increases the gate open period becomes shorter, since the knock signal becomes larger to an extent that is greater than that which corresponds thereto, the A/D-converted value of the knock signal integrated value becomes larger (in the case where the knock sensor is normal). On the other hand, in the abnormal case, as the number of engine rotations increases with the result that the gate open period decreases, the A/D-converted value of the knock signal integrated value decreases with the result that the difference in A/D-converted value between the normal case and the abnormal case becomes enlarged.

Figure 14:
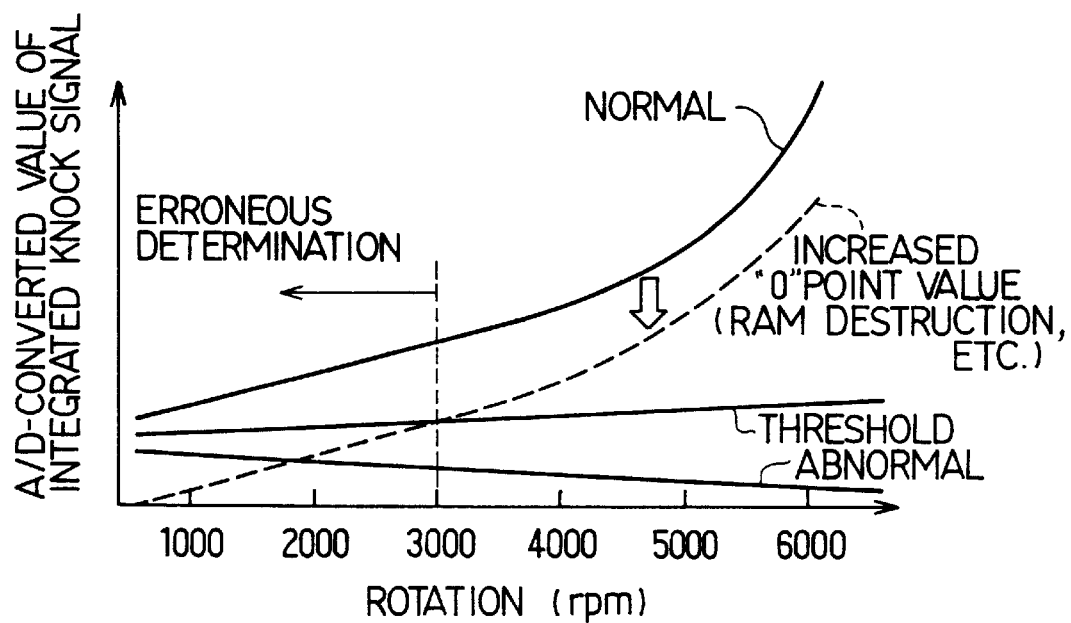
FIG. 14 is a diagram illustrating a rotation range wherein determination error is made when the A/D-converted value of the knock signal integrated value has been "0" point corrected using an erroneous "0" point.

However, the construction wherein taking-in of the "0" point data is performed in only a range of low rotation as in the case of the first embodiment is accompanied by the following inconvenience when during, for example, a long high-speed travel the "0" point value deviates due to temperature variations or the like. That is, although almost no problem arises from such deviation during high rotation, when "0" point correction is performed at the time of low rotation resulting from rapid deceleration, it results that such "0" point correction is performed with the use of the "0" point value that involves an offset. Therefore, it is likely that adverse effect may be had on the malfunction determination. That is, under the assumption that no taking-in of the "0" point data was performed during high rotation, when the offset value (voltage) from the "0" point value increases during high rotation due to RAM data destruction, temperature variations, as illustrated in a dotted line in FIG. 14 the A/D-converted value (the value after "0" point correction) of the knock signal integrated value decreases. As a result, when deceleration is made from the high rotation time, it is likely that determination error may occur.

In this respect, in the second embodiment, since "0" point correction is periodically performed in even a range of high rotation, it is possible to update the "0" point value during high rotation promptly also by the offset voltage therefrom that has occurred during high rotations. Therefore, in even the above-mentioned case, it is possible to prevent occurrence of error in the malfunction determination.

It is to be noted that in the second embodiment taking-in of the "0" point data can be performed in units of a prescribed number of ignition times or a prescribed time period not only in a range of high rotation but also in a range of low rotation.

(Third Embodiment)

Figure 15:
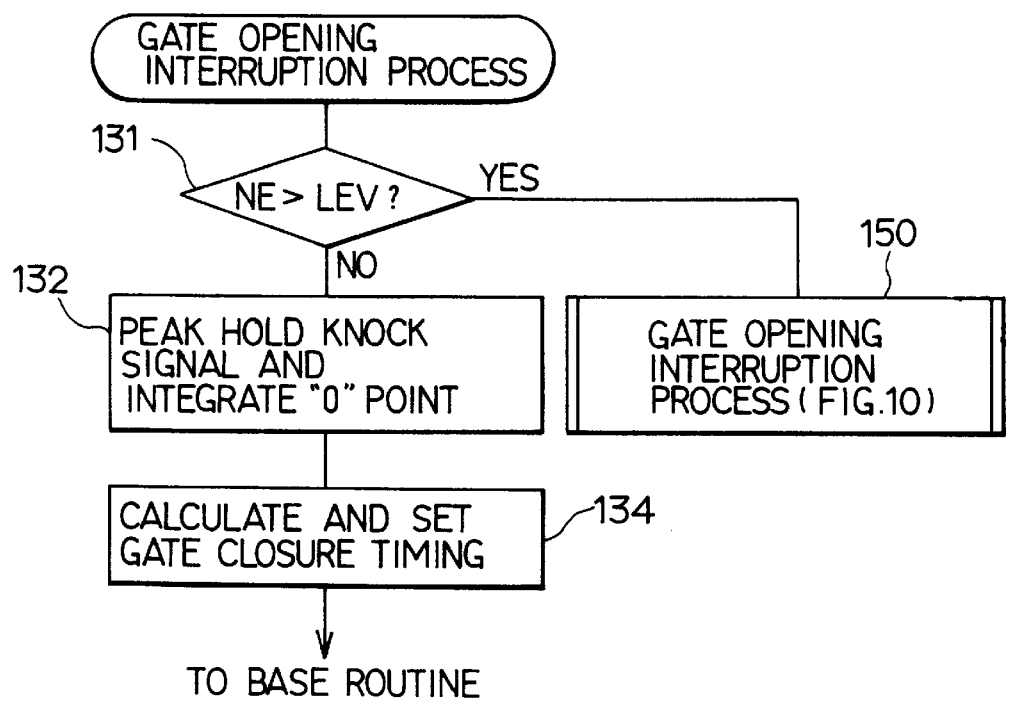
FIG. 15 is a flow chart illustrating a flow of processes in a gate opening interruption processing in a third embodiment of the present invention.

In a third embodiment of the present invention illustrated in FIG. 15, it is arranged to perform taking-in of the "0" point data in a form wherein the first embodiment is combined with the second embodiment.

In the third embodiment, in the gate opening interruption processing routine, first, in step 131, it is determined whether or not the number NE of engine rotations exceeds a prescribed number of engine rotations LEV (e.g. 1000 rpm). If NE≦LEV, the operation proceeds to step 132 in which the peak-hold (P/H) of the knock signal and the "0" point integration of the integrating circuit 51 are started. Then, in the next step 134, the gate closure timing is calculated and set, the operation then returning to the base routine processing. As a result of this, in a range of low rotation wherein NE≦LEV, taking-in of the "0" point data can be performed during an gate open period each time ignition is done (in units of TDC). In this case, as the gate closing interruption processing, there is executed the gate closing interruption processing of FIG. 8 which is used in the above-mentioned first embodiment.

On the other hand, if NE>LEV, the operation proceeds to step 150 in which there is executed the gate opening interruption processing routine of FIG. 10 which is used in the above-mentioned second embodiment. As a result of this, when NE>LEV, the "0" point integration of the integrating circuit 51 is performed continuously over a plurality of gate open periods in units of a prescribed number of ignition times or a prescribed time period until a prescribed amount of integrating time elapses. In this case, as the gate closing interrution processing routine there is executed the gate closing interruption processing routine of FIG. 11 which is used in the above-mentioned second embodiment.

Meanwhile, in the above-mentioned embodiments, since in step 102 in FIG. 4 it is arranged to take in the initial value of the "0" point at the initial time, it is possible to perform "0" point correction immediately after initialization and therefore perform accurate malfunction determination from immediately after the start of the control program.

(Fourth Embodiment)

In the method wherein taking-in is performed of the "0" point data during the low rotation as in the first embodiment, when the number of idle rotations is large, there may be a case where no taking-in can be made of the "0" point data. In such a case, for a while, malfunction determination continues to be performed with no taking-in being performed of the "0" point data, with the result that it is likely that determination error may occur.

Figure 16:
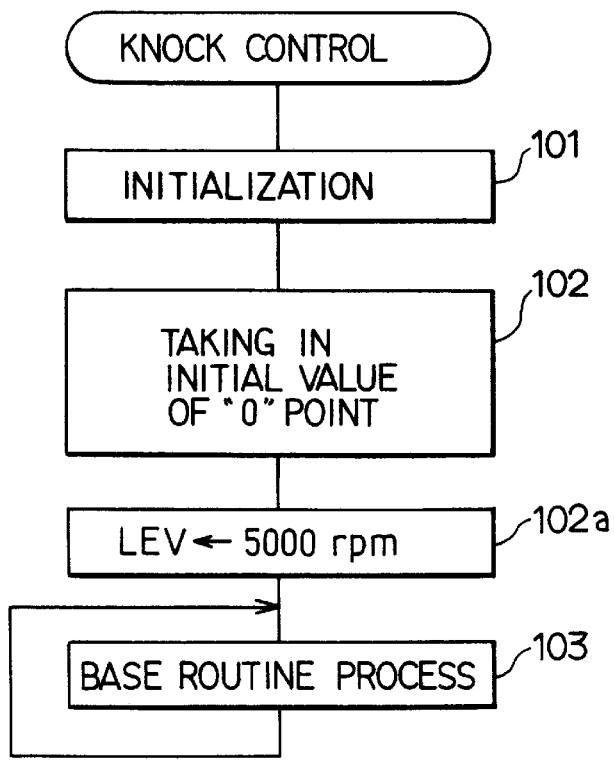
FIG. 16 is a flow chart illustrating a flow of processes in a knock control program in a fourth embodiment of the present invention.
Figure 17:
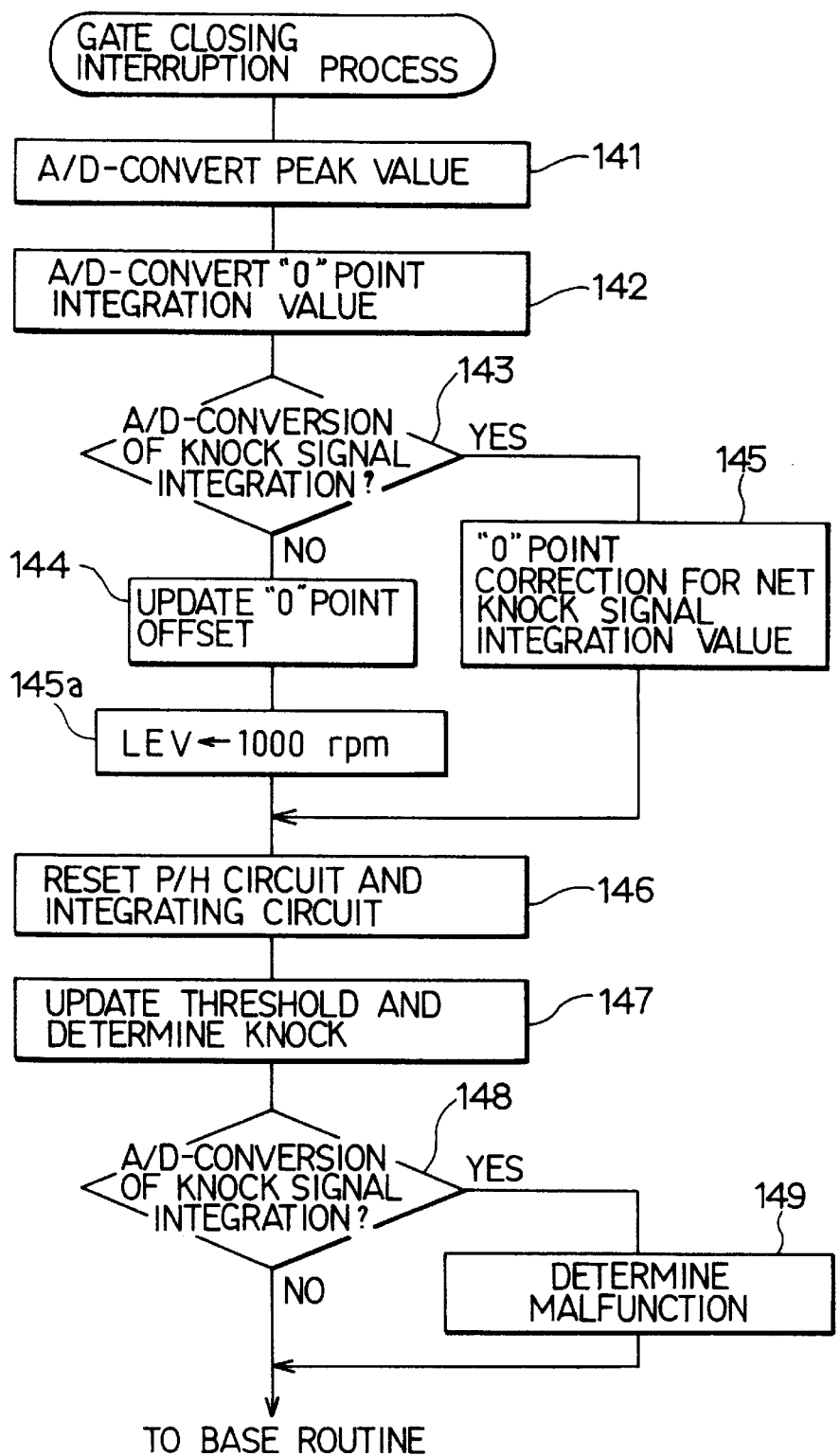
FIG. 17 is a flow chart illustrating a flow of processes in a gate closing interruption processing in the fourth embodiment.

As a countermeasure against this, in a fourth embodiment of the present invention that is illustrated in FIGS. 16 and 17, the number LEV of rotations for setting a range of rotation wherein taking-in of the "0" point data is performed is set at the initial time to be at a large value and, after taking-in is performed of the initial "0" point value, this number LEV of rotations is returned to a small value that corresponds to a range of low rotation. That is, in a knock control program of FIG. 16, there is added a processing of step 102a in which the number LEV of rotations is set at, for example, 5000 rpm, the remaining processings being the same as those in FIG. 4. On the other hand, in a gate closing interruption processing routine of FIG. 17, a processing of step 145a in which the number LEV of rotations is returned to, for example, 1000 rpm is added next to step 144 (updating of the "0" point data), the remaining processings being the same as those in FIG. 8.

If the above-mentioned processings are executed, even when the number of idle rotations is large, it is possible to perform without fail taking-in of the "0" point data at least once at the beginning of the program execution, with the result that "0" point correction can be reliably performed from immediately after the start of the program execution. This enables the performance of accurate malfunction determination from immediately thereafter.

Each of the above-explained first to fourth embodiments is an embodiment to which the present invention is applied regarding the "0" point correction that is performed with respect to the A/D-converted value of the output signal (knock signal integrated value) from the integrating circuit 51.

(Fifth Embodiment)

In contrast, in a fifth embodiment of the present invention that is illustrated in FIGS. 18 to 24 performs the "0" point correction that is performed with respect to the A/D-converted value of the output signal (knock signal peak value) from the P/H circuit 48. This embodiment will hereafter be explained.

Figure 18:
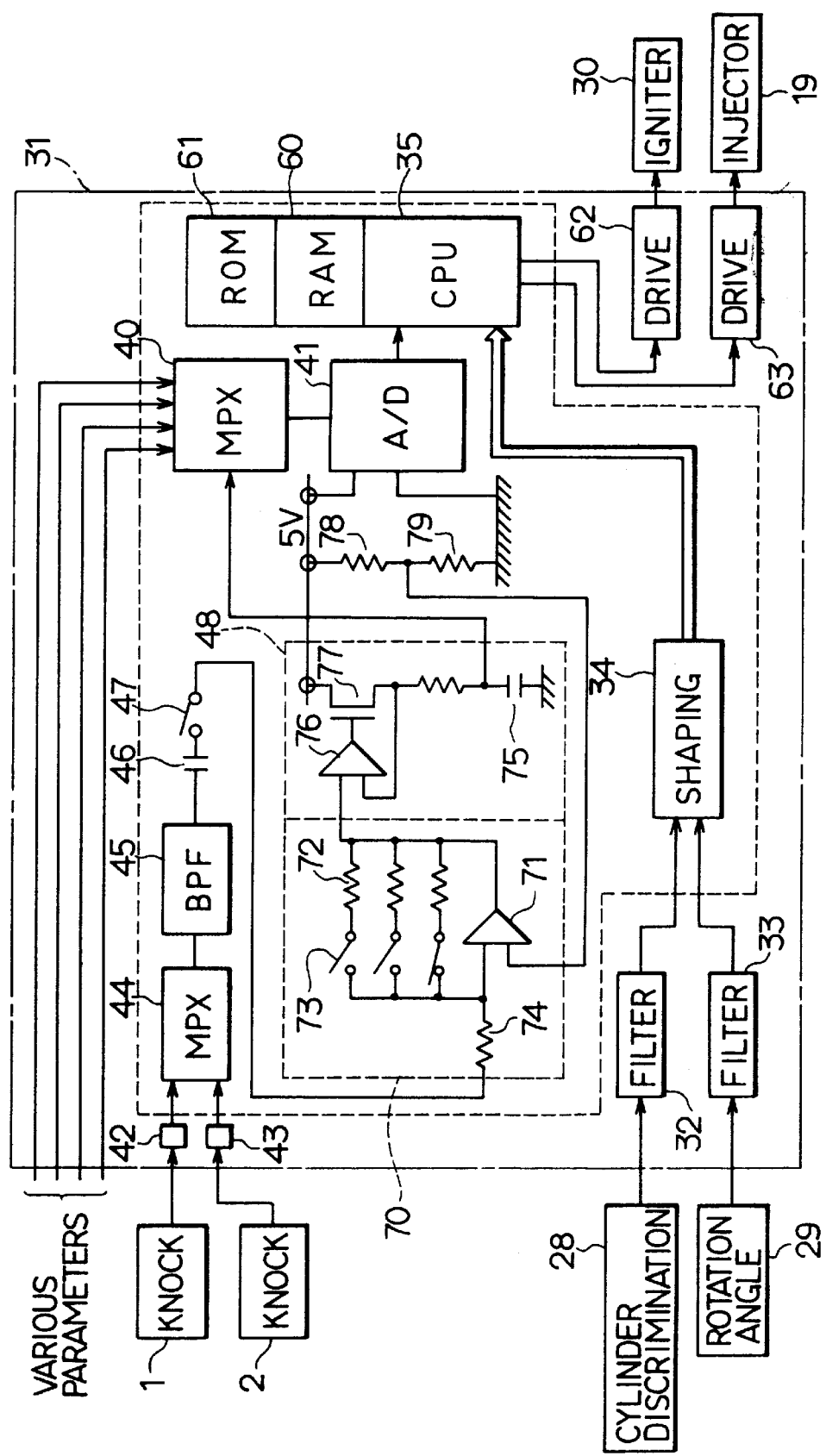
FIG. 18 is a circuit diagram illustrating the construction of an entire engine control unit in a fifth embodiment of the present invention.

First, the circuit construction will be explained with reference to FIG. 18. On the output side of a band pass filter 45 for executing filter processing with respect to a knock signal there are connected in series therewith a coupling capacitor 46, a switch 47, a gain circuit 70 and a P/H circuit 48. In the gain circuit 70, a plurality of resistors 72 that differ in resistance value from each other are provided in parallel with each other as feedback resistors for an operational amplifier 71. A gain change-over switch 73 is provided in series with each resistor 72. By selectively making each switch 73 "on" or "off", it is arranged to change over the amplification factor. This amplification factor is set by the resistance ratio between the resistance of an input resistor 74 of the operational amplifier 71 and the resistance of each feedback resistor 72. To the operational amplifier 71 there is input as a reference point ("0" point) of the knock signal a voltage signal of 2.5V that is prepared by bisecting a power source voltage of 5V by two resistors 78 and 79 whose resistance values are the same.

On the other hand, the P/H circuit 48 has a holding capacitor 75. The output voltage from the gain circuit 70 and the charging voltage from the holding capacitor 75 are input to an operational amplifier 76. Whereby, when the former is higher than the latter, a transistor 77 is turned "on" to thereby charge the holding capacitor 75. By repeatedly performing this operation, the holding capacitor 75 is made to hold the peak value of the knock signal. The charged voltage of this holding capacitor 75 is input through a multiplexer 40 to an A/D-converter 41 and is A/D-converted there and supplied to the CPU 35. Then, after the peak value is A/D-converted, the charge that is charged in the holding capacitor 75 is discharged through a discharging circuit (not illustrated), with the result that the P/H circuit is reset. It is to be noted that in this fifth embodiment there is omitted the use of the integrating circuit 51 provided in each of the above-mentioned embodiment. The remaining circuit construction is the same as that illustrated in FIG. 1.

Figure 19:
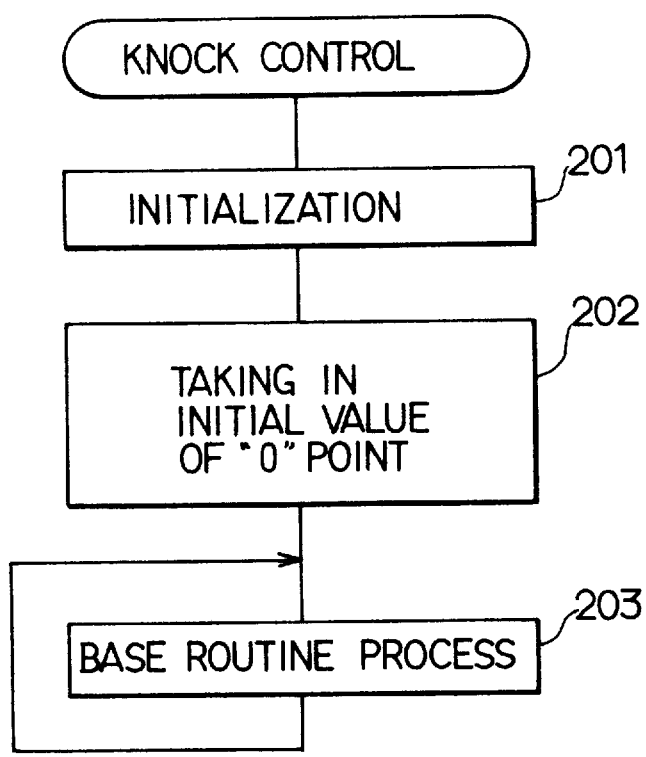
FIG. 19 is a flow chart illustrating a flow of processes in a knock control program in the fifth embodiment.

The processings executed in each of the routines which concern the knock determination and which are illustrated in FIGS. 19 to 23 will be explained in detail hereunder. When resetting of the CPU 35 is released by closure of a power source to the engine control unit 31, a knock control program of FIG. 19 is started. In this knock control program, first, in step 201, the initial processing is executed, whereby initialization of RAM 60, initialization of interruptions and timers, settings of initial values of various data, etc. are executed. Then, in step 202, taking-in is performed of the "0" point initial value of the P/H circuit 48. This taking-in of the "0" point data is performed, with the switch 47 on the input side of the gain circuit 70 being made "off", by holding by the holding capacitor 75 the reference voltage (2.5V) that is given by the resistors 78 and 79 and that is handled as the "0" point and by A/D-converting the thus held reference voltage by the A/D-converter 41. Then, in step 203, there is executed as a loop the base routine processing in which there are executed processings such as clearing of the stack area inside the RAM 60 for, during execution of the program, storing temporarily calculation data, input data and the like.

Figure 20:
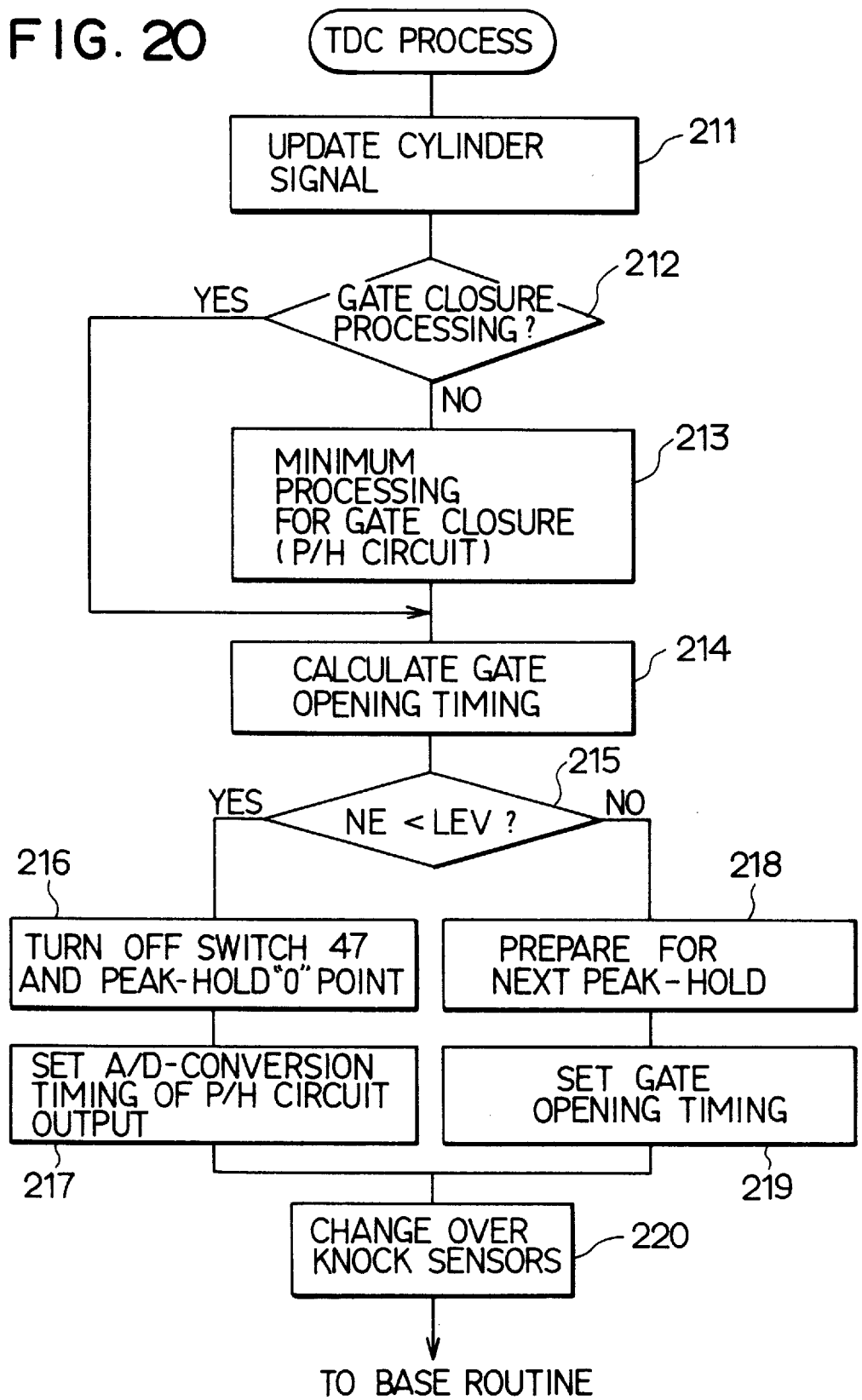
FIG. 20 is a flow chart illustrating a flow of processes in a TDC processing in the fifth embodiment.

On the other hand, in the TDC processing routine that is illustrated in FIG. 20, first, in step 211, in the same way as in step 121 in FIG. 6, the cylinder signal (TDC) is updated by the counted value of the cylinder discrimination counter CRNK. In a subsequent step 212, it is determined whether or not the gate closure processing as described later is finished. If the result of this determination is YES, the operation jumps over to step 214. However, if the result of that determination is NO, the operation proceeds to step 213 in which resetting of the P/H circuit 48, which is a minmum necessary processing for the gate closure processing, is executed, the operation then proceeding to step 214.

In step 214, calculation is performed of the gate opening timing which is a peak-hold start timing of the knock signal. In the next step 215, the number NE of engine rotations is compared with a prescribed number LEV of rotations (e.g. 1000 rpm). If NE<LEV, the operation proceeds to step 216 in which, with the switch 47 on the input side of the gain circuit 70 being turned "off", peak-hold (P/H) is started of the "0" point data of the P/H circuit 48. Then, in the next step 217, there is set a timing for performing A/D-conversion with respect to the output voltage ("0" point) from the P/H circuit 48. Then, the knock sensors 1 and 2 are changed over therebetween by the use of the cylinder signal that is updated in the preceding step 211 (step 220).

On the other hand, if NE≧LEV, the operation proceeds to step 218 in which preparations for the next peak-hold circuit such as setting of the gain, etc. are performed. Then, in a subsequent step 219, the gate opening timing is set to the timing that is calculated in the step 214. Then, the knock sensors 1 and 2 are changed over therebetween by the use of the cylinder signal (step 220).

Figure 21:
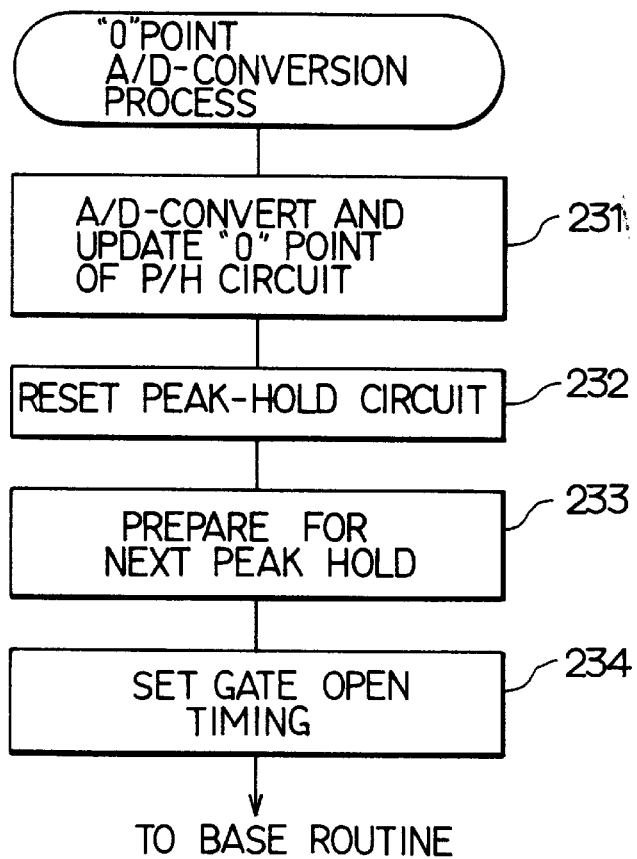
FIG. 21 is a flow chart illustrating a flow of processes in a "0" point A/D-conversion processing in the fifth embodiment.

Also, the A/D-conversion processing routine that is illustrated in FIG. 21 is started with the timing which when NE<LEV is set in step 217 in FIG. 20, whereby the following processings are executed. First, in step 231, the "0" point data of the P/H circuit 48 starts to be A/D-converted, and then is taken into the CPU 35 whereby the resulting "0" point value is updated. In a subsequent step 232, resetting of the P/H circuit 48 (discharging of the holding capacitor 75) is performed. Thereafter, in step 233, preparations for the next succeeding peak-hold such as setting of the gain are performed. Then, in a subsequent step 234, the gate opening timing is set, the operation then proceeding to the base routine processing.

Figure 22:
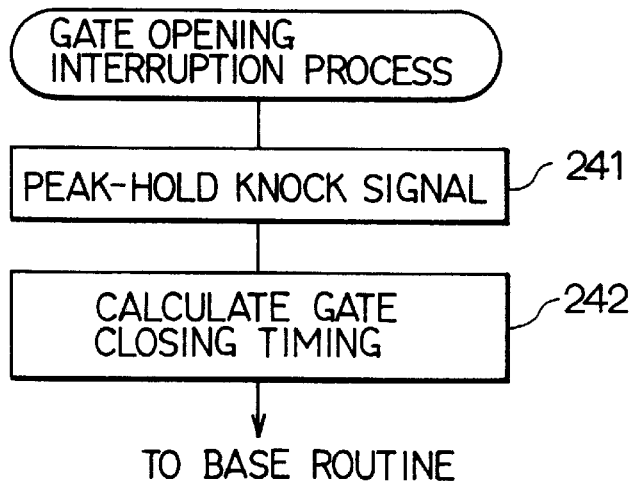
FIG. 22 is a flow chart illustrating a flow of processes in a gate opening interruption processing in the fifth embodiment.

On the other hand, the gate opening interruption processing routine that is illustrated in FIG. 22 is started with the gate opening timing which when NE≧LEV is set in step 219 in FIG. 20. In this gate opening interruption processing routine, first, in step 241, peak-hold of the knock signal in the P/H circuit 48 is started. In the next step 242, the gate closure timing which is a P/H end timing for the knock signal is calculated and set, the operation then returning to the base routine processing.

Figure 23:
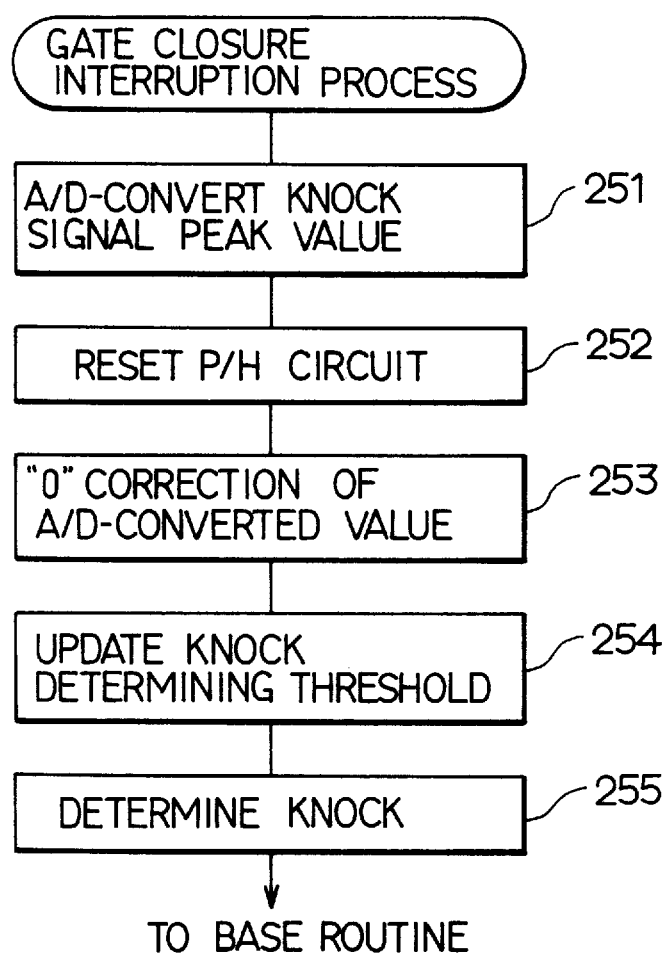
FIG. 23 is a flow chart illustrating a flow of processes in a gate closing interruption processing in the fifth embodiment.

Also, the gate closing interruption processing routine that is illustrated in FIG. 23 is started with the gate closure timing which was calculated and set in step 242 in FIG. 22 or with the gate open timing which is set in step 234 in FIG. 21. In this gate closing interruption processing routine, first, in step 251, the output signal (knock signal peak value) from the P/H hold circuit 48 is A/D-converted by the A/D-converter 41 and the thus converted signal is taken into the CPU 35. Thereafter, in step 252, the P/H circuit 48 is reset. In a subsequent step 253, the "0" point A/D-converted value (offset value) that is stored in the RAM 60 is subtracted from the A/D-converted value of the present knock signal peak value to thereby determine a net knock signal peak value, thus performing "0" point correction. Then, in step 254, the knock-determining value is updated in correspondence with the mean value (background) of the knock signal and this knock-determining value is compared with the knock signal peak value, whereupon a determination is made on the occurrence of a knock. Then, the result of this determination is outputted (in step 255).

Figure 24:
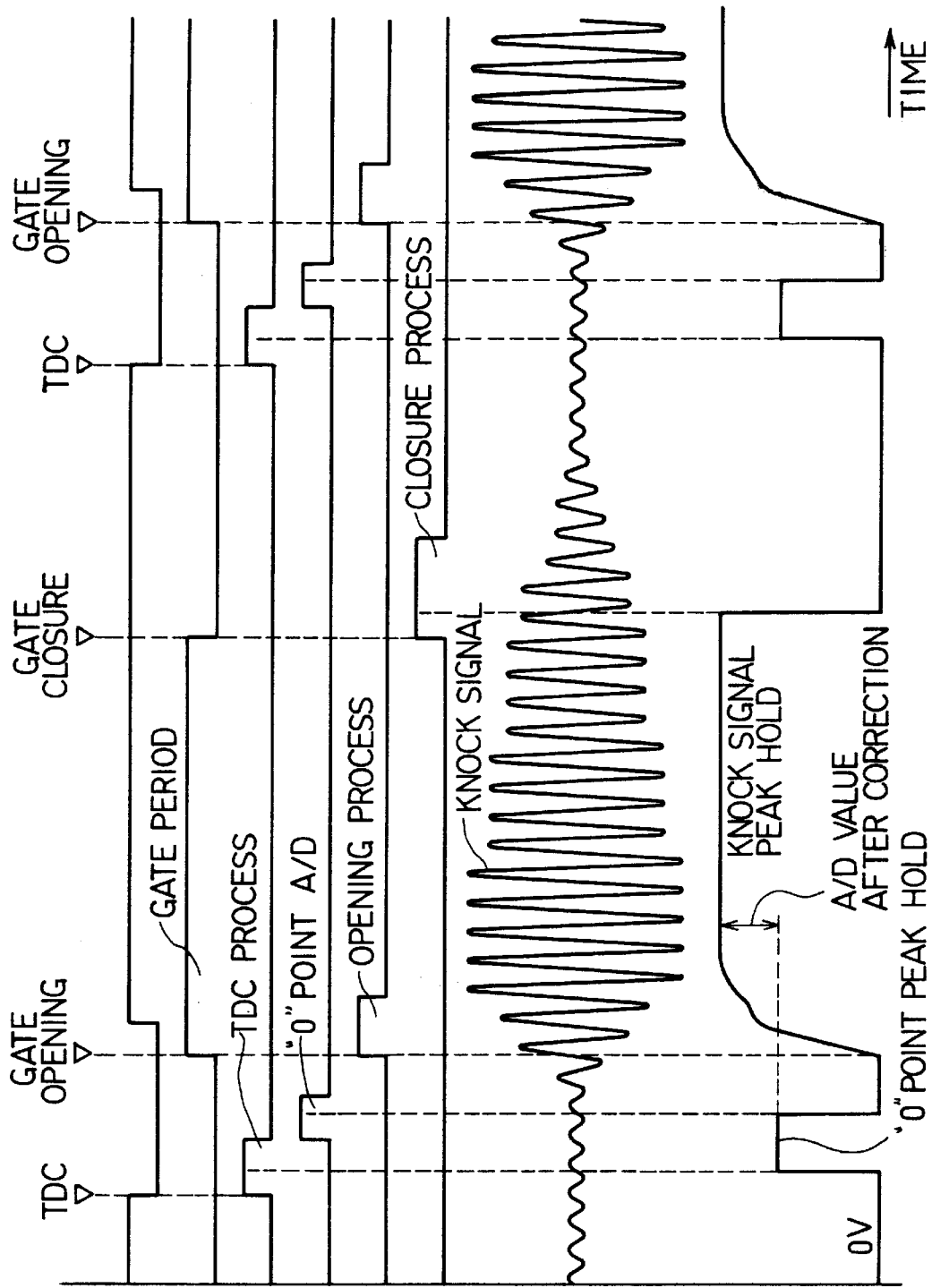
FIG. 24 is a time chart illustrating timings for execution of the respective processings in the fifth embodiment.

Meanwhile, FIG. 24 is a time chart illustrating the operations of the signal processing circuit when the above-mentioned respective processings routines are executed. The TDC processing routine of FIG. 20 is executed in units of TDC. That is, when the number NE of engine rotations is lower than the prescribed number LEV of rotations, peak-hold (P/H) of the "0" point data is performed each time the TDC processing routine is executed. Then, through the execution of the "0" point A/D-conversion processing routine of FIG. 21, the "0" point value is A/D-converted, whereupon the "0" point value is updated and also the P/H circuit 48 is reset. The above-mentioned "0" point peak-hold, A/D-conversion and P/H circuit 48 resetting are performed during a time period of from the TDC timing to the gate open timing.

Then, simultaneously with the gate opening, the gate opening interruption processing routine of FIG. 22 is executed whereby peak-hold of the knock signal is started. Thereafter, with the gate closure timing, the gate closing interruption processing routine of FIG. 23 is executed whereby A/D-conversion is performed of the knock signal peak value that is held during the gate open period. Resetting of the P/H circuit 48 and "0" point correction are also performed. As mentioned above, when the number NE of engine rotation NE is smaller than the prescribed number LEV of rotations, a series of processings from taking-in of the "0" point data to "0" point correction are repeatedly executed in units of TDC. Conversely, where the former NE is not smaller than the latter LEV, no taking-in is performed of the "0" point data and only peak-hold of the knock signal and "0" point correction alone are performed.

In the above-explained fifth embodiment, the A/D-converter 41 used with respect to a knock signal having a reference voltage and another sensor signal having a reference voltage that is different therefrom are made common. Whereby, even when the reference voltage of the P/H circuit 48 is being different from the reference voltage of the A/D-converter 41, since the A/D-converted value of the knock signal peak value is "0" point corrected, it is possible to remove therefrom an amount of "0" point offset that occurs due to variations and temperature characteristics of the resistors 78 and 79 for generating the reference voltage (2.5V). As a result, it is possible to perform knock determination accurately.

In general, since the gate open period is set based on the time period that covers from the previous TDC timing to the present TDC timing, the length of the set gate opening period comes to differ. At the rapid acceleration time, although it may happen that the time period that covers from one gate closure timing to the next succeeding TDC timing becomes shorter, the time period that covers from one TDC timing to the next succeeding gate open timing does not shorten once having been set. Accordingly, if taking-in is performed of the "0" point data during the time period of from one TDC timing to the next succeeding gate open timing as in the above-mentioned fifth embodiment, at even the rapid acceleration time it is possible to ensure a sufficient amount of taking-in time. Accordingly, for each TDC signal, taking-in can be performed of the "0" point data to thereby update the "0" point value, with the result that in the case of the RAM data determination havig occurred, it is possible to restore to a correct "0" point data promptly. In addition, since the "0" point taking-in time period has no relevance to the acceleration, determination thereon becomes unnecessary and also stable "0" point correction that is free from the influence of the acceleration can be performed.

Especially, at the low rotation time, since the time period that covers from the TDC timing to the gate open timing is sufficiently long compared to the time period that is needed for peak-holding of the "0" point data, if taking-in is performed of the "0" point data during low rotation as in the above-mentioned fifth embodiment, it is possible to reliably perform taking-in of the "0" point data every time.

Meanwhile, as illustrated in FIG. 24, the time period that covers from the gate closure timing to the next succeeding gate opening timing is set long compared with the time period that covers from the TDC timing to the next succeeding gate open timing. The reason for this is firstly that the timing with wich the amplitude of the knock signal increases is on a side that is nearer to the immediately preceding TDC timing and secondly that the time period that covers from the gate closure timing to the next succeeding TDC timing is set long so that even when acceleration occurs the gate closure processing may be possible. For this reason, it may be arranged to perform taking-in of the "0" point of the P/H circuit 48 during the time period of from the gate closure timing to the next succeeding TDC timing.

(Sixth Embodiment)

A sixth embodiment of the present invention will hereafter be explained with reference to FIGS. 25 to 27. In this sixth embodiment of the present invention also, the knock control program of FIG. 19 and gate opening interruption processing routine of FIG. 22 used in the fifth embodiment are executed.

Figure 25:
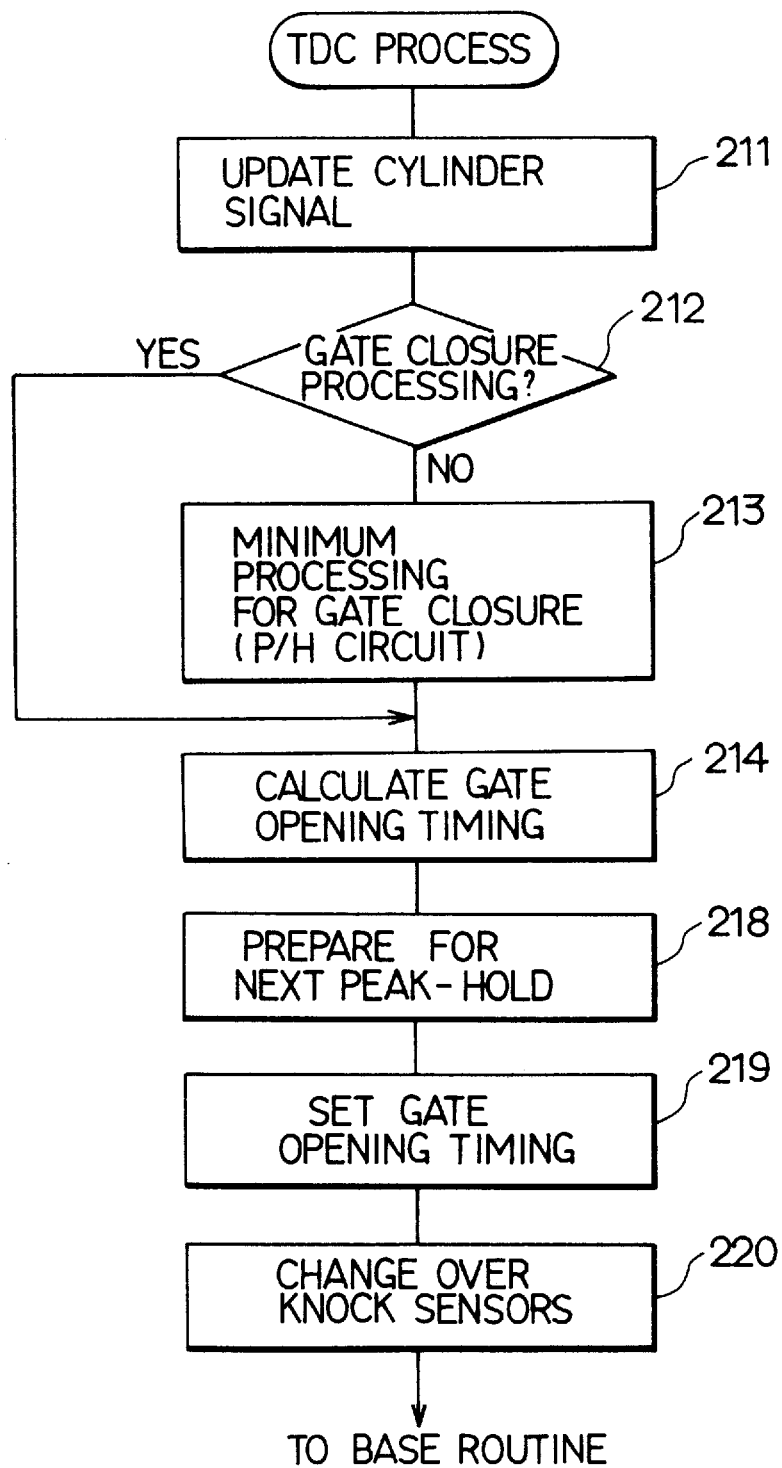
FIG. 25 is a flow chart illustrating a flow of processes in a TDC processing in a sixth embodiment of the present invention.

The TDC processing routine that is illustrated in FIG. 25 is one that is prepared by omitting the processings executed in steps 215, 216 and 217 (taking-in of the "0" point data at the time of NE<LEV) from the TDC processing routine of FIG. 20, the remaining processings being the same as those in the routine of FIG. 20. That is, in the TDC processing routine of FIG. 25, after in step 214 the gate opening timing is calculated, the operation proceeds to step 218 in which preparations for the next peak-hold such as setting of the gain, etc. are performed. Then, in a subsequent step 219, the gate opening timing is set whereby the knock sensors 1 and 2 are changed over therebetween by the use of the cylinder signal (step 220).

On the other hand, the gate closing interruption processing routine that is illustrated in FIG. 26 is one that is prepared by adding steps 253a and 253b between the step 253 and step 254 in the gate closing interruption processing routine of FIG. 23. That is, in the gate closing interruption processing routine of FIG. 26, after in step 253 "0" point correction is peformed, the operation proceeds to step 253a in which the switch 47 on the input side of the gain circuit 70 is turned "off" and in this state peak-hold of the "0" point in the P/H circuit 48 is started. Then, in the next step 253b, the timing for A/D-converting the output voltage ("0" point) from the P/H circuit 48 is set. Thereafter, the knock-determining value is updated (step 254) and determination on a knock and outputting of the determined result are performed. As mentioned above, in the sixth embodiment, taking-in of the "0" point data is performed through the execution of the gate closing interruption processing routine.

Also, the "0" point A/D-conversion processing routine that is illustrated in FIG. 27 is one that is prepared by omitting the processings executed in steps 233 and 234 from the "0" point A/D-conversion processing routine of FIG. 21. That is, the "0" point A/D-conversion processing routine of FIG. 21 is started over an entire rotation range with the timing having been set in step 253b in FIG. 26. Firstly, in step 231, A/D-conversion of the "0" point of the P/H circuit 48 is started and the A/D-converted value is read into the CPU 35 to thereby update the "0" point value. Then, in a subsequent step 232, resetting of the P/H circuit 48 is performed, the operation then returning to the base routine.

Figure 28:
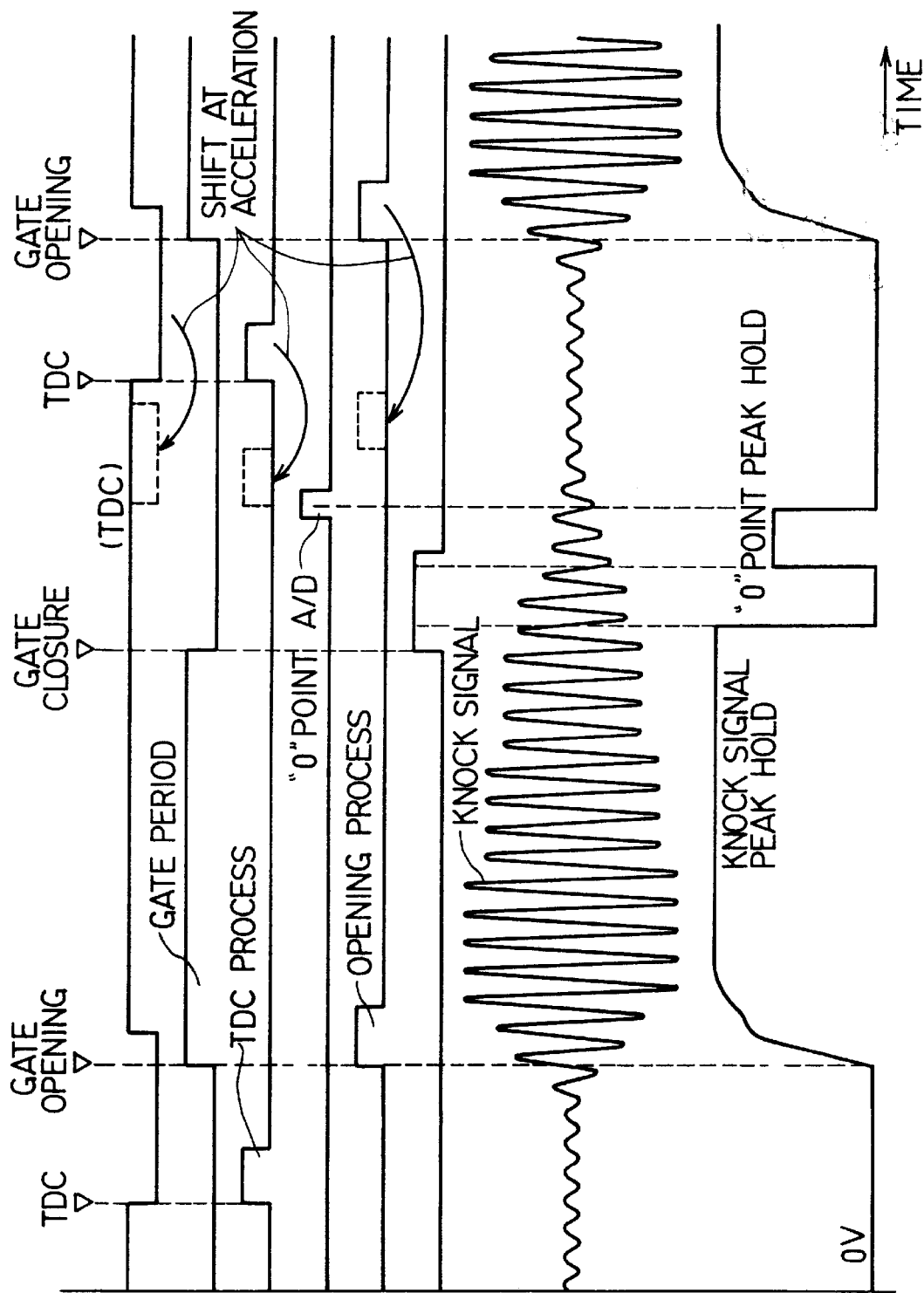
FIG. 28 is a time chart illustrating timings for execution of the respective processings in the sixth embodiment.

Meanwhile, FIG. 28 is a time chart illustrating the operations that occur when the above-mentioned respective processings routine have been executed. Simultaneously with the gate opening, the gate opening interruption processing routine is executed whereby the peak-hold of the knock signal is started. Thereafter, with the gate closure timing, the gate closure interruption processing routine of FIG. 26 is executed whereby the knock signal peak value that is held during the gate open period is A/D-converted. Subsequently, resetting of the P/H circuit 48 and "0" point correction are performed. Further, within the time period that covers from the gate closure timing to the next succeeding TDC timing, peak-hold of the "0" point data is performed through the execution of the gate closing interruption processing routine. Then, through the execution of the "0" point A/D-conversion processing routine, the "0" point value is A/D-converted and the "0" point value is updated while, on the other hand, the P/H circuit 48 is reset.

In general, the time period that covers from the gate closure timing to the next succeeding TDC timing is long compared with the time period that covers from the TDC timing to the next succeeding gate opening timing. Therefore, if it is arranged to perform the peak-hold of the "0" point data in the P/H circuit 48 during the time period of from the gate closure timing to the next succeeding TDC timing, it is possible to ensure a sufficient amount of "0" point data taking-in time over an entire range of rotation from low rotation to high rotation and also, at even the high rotation time, perform taking-in of the "0" point data. For this reason, when the vehicle travels continuously in a range of high rotation, such as when it travels on a turnpike road, even if the stored values in the RAM 60 for storing the "0" point data is destroyed due to noises or the like or even if an offset occurs on the "0" point data due to the temperature variations or the like, it is possible to promptly update the "0" point data to a correct value during high speed travel and thereby prevent the occurrence of error in the knock determination.

Meanwhile, since the gate opening period is set based on the time period between the previous and the present TDC timing, at the acceleration time the time period of from the gate closure timing to the next succeeding TDC timing becomes short, as illustrated in dotted lines in FIG. 28, by the extent which corresponds to the acceleration. Further, at a further rapid acceleration time, it is likely that the execution of the gate closure processing may be canceled as a result of the TDC processing having interrupted the gate closure processing. Further, at a yet further rapid acceleration time, it is likely that the gate closure processing per se cannot be executed. However, it is unlikely that rapid acceleration persists for a long period of time. Also, except for the rapid acceleration time, it is possible to ensure a sufficient interval of "0" point taking-in time regardless of the engine rotations number during the time period of from the gate closure timing to the next succeeding TDC timing. Therefore, since at the rapid acceleration time the time period in which the "0" point taking-in time length cannot be ensured is short, no problem arises.

(Seventh Embodiment)

Figure 29:
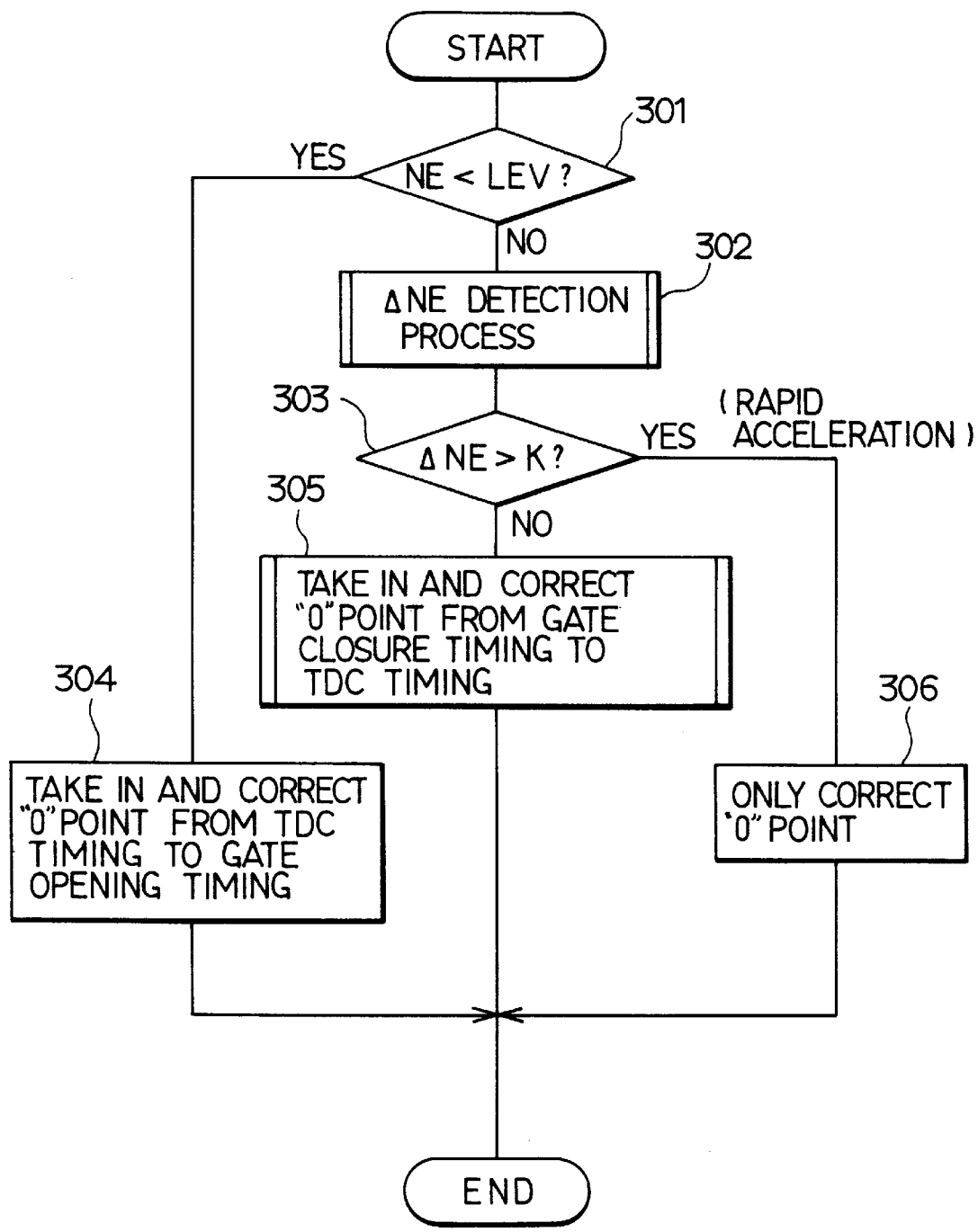
FIG. 29 is a flow chart illustrating a flow of processes in a "0" point correction processing in a seventh embodiment of the present invention.
Figure 30:
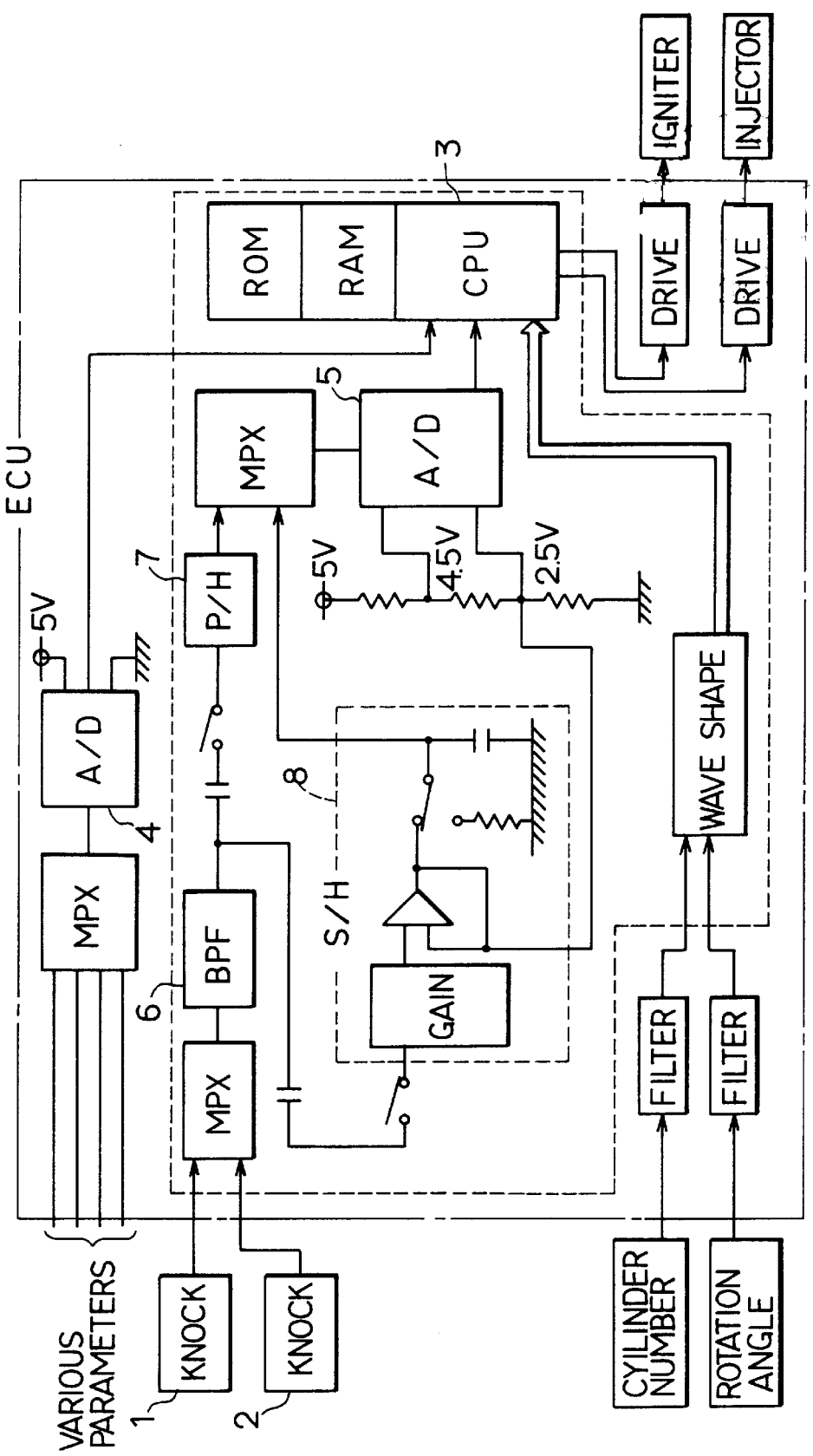
FIG. 30 is a circuit diagram illustrating the construction of a conventional entire engine control unit.

FIG. 29 illustrates a seventh embodiment of the present invention. This seventh embodiment is one which is prepared by combining the above-mentioned fifth embodiment and the above-mentioned sixth embodiment. That is, in step 301, the number NE of engine rotations is compared with the prescribed number LEV of rotations. If NE<LEV, the operation proceeds to step 304. In this step 304, in the same way as in the fifth embodiment, during the time period that covers from the TDC timing to the next succeeding gate opening timing, taking-in is performed of the "0" point data of the P/H circuit 48 to thereby update the previous "0" point data. According to this updated "0" point data, "0" point correction is performed of the A/D-converted value of the knock signal peak value.

In contrast, if NE≧LEV, the operation proceeds to step 302 in which a change ΔNE in the rotations number is detected from the difference between the previous and the present rotations number. Then, in step 303, whether or not the acceleration is a rapid acceleration is determined according to whether or not the change a NE in the rotations number is large than a prescribed value K. When a NE≦K (a rapid acceleration has not been made), the operation proceeds to step 305. In this step 305, in the same way as in the sixth embodiment, during the time period of from the gate closure timing to the next succeeding TDC timing, taking-in is performed of the "0" point data of the P/H circuit 48 to thereby update the previous "0" point data. Then, according to this updated "0" point data, "0" point correction is performed of the A/D-converted value of the knock signal peak value.

If in step 303 ΔNE>K (rapid acceleration), the operation proceeds to step 306. In this step 306, no taking-in is performed of the "0" point data and only "0" point correction is performed using the "0" point value that was determined previously.

This seventh embodiment is the most advantageous embodiment which has both the merit of the fifth embodiment (the merit of the operation being free from the influence of the acceleration) and the merit of the sixth embodiment (the merit of enabling taking-in of the "0" point data at even the high rotation time).

Although in each of the above-explained fifth to seventh embodiments the use of the integrating circuit for integrating the knock signal has been omitted, it may be arranged to add the integrating circuit to each of these embodiments and thereby execute in a form wherein the "0" point correction method for any one of the integrating circuits in the first to fourth embodiments is combined with the processing method therefor.

It is to be noted that although each of the above-mentioned embodiments has been explained, as an example, regarding the case of an in-line 6-cylinder engine (two knock sensors are used), the number of cylinders and type of engine and the number of knock sensors used thereon are of course not limited to those in the above-mentioned embodiments. Further, the applicable scope of the present invention is not limited to the engine control unit equipped with knock sensors and the invention may be applied to other on-vehicle electronic control circuits or to various electronic control circuits other than those for use on vehicles.

What is claimed is:

1. A signal processing circuit comprising:

first signal outputting means for outputting a first signal from the outside as a first analog signal that uses a first reference voltage as a reference;

second signal outputting means for outputting a second signal from the outside as a second analog signal that uses a second reference voltage different from the first reference voltage as a reference;

signal selecting means for selecting either one of the first and the second analog signals;

an A/D-converter for performing an A/D-conversion of the analog signals selected from the signal selecting means to digital signals on the basis of the second reference voltage; and calculation processing means for performing prescribed calculation processing by the use of the digital signals obtained by the A/D-conversion made by the A/D-converter, wherein the calculation processing means A/D-converts at a prescribed timing the first reference voltage of the first signal outputting means by the A/D-converter and takes in the A/D-converted value and corrects the A/D-converted value of the output signal from the first signal outputting means on the basis of an offset voltage of the first reference voltage.

2. A signal processing ciruit as set forth in claim 1, wherein the first signal is an output signal from a knock sensor for detecting a knock of an internal combustion engine.

3. A signal processing circuit as set forth in claim 1, wherein the first signal outputting means includes:

switching means provided midway in a signal transmission path; and signal calculating means for performing prescribed processing with respect to the first analog signal and outputting a resulting signal.

4. A signal processing circuit as set forth in claim 3, wherein the switching means is provided midway in the signal transmission path between an input portion for inputting the first signal from the first signal outputting means and the signal calculating means.

5. A signal processing circuit as set forth in claim 3, wherein the signal calculating means includes a peak-hold circuit for holding a maximum value of the first analog signal.

6. A signal processing circuit as set forth in claim 5, wherein the signal calculating means is provided with resetting means for resetting the maximum value of the first analog signal held by the peak-hold circuit.

7. A signal processing circuit as set forth in claim 3, wherein the signal calculating means is provided with integrating circuit for integrating the first analog signal.

8. A signal processing circuit as set forth in claim 7, wherein the signal calculating means is provided with resetting means for resetting an integrated value of the first analog signal held by the integrating circuit.

9. A signal processing circuit as set forth in claim 5, wherein the signal calculating means is provided with knock detecting means for detecting an occurrence of a knock in an internal combustion engine on the basis of the maximum value of the first analog signal held by the peak-hold circuit.

10. A signal processing circuit as set forth in claim 7, wherein the signal calculating means executes a diagnosis on the first signal on the basis of the integrated value of the first analog signal held by the integrating circuit.

11. A signal processing circuit as set forth in claim 3, wherein the calculation processing means interrupts the switching means at a prescribed timing to thereby read in the first reference voltage by A/D-converting the first reference voltage through operation of the A/D-converter and then turns the switching means "on" to thereby correct the A/D-converted value of the first analog signal from the first signal outputting means on the basis of an offset voltage that occurs from the first reference voltage.

12. A signal processing circuit as set forth in claim 7, wherein the calculation processing means performs integration with respect to the first reference voltage of the integrating circuit when the number of rotations of an internal combustion engine is less than a prescribed number of rotations.

13. A signal processing circuit as set forth in claim 12, wherein the calculation processing means performs within a knock determination time period integration of a knock signal and integration of the first reference voltage by the integrating circuit.

14. A signal processing circuit as set forth in claim 7, wherein the calculation processing means performs integration of the first reference voltage of the integrating circuit continuously over a plurality of knock determination time periods until a prescribed amount of integrating time lapses.

15. A signal processing circuit as set forth in claim 14, wherein the calculation processing means is disabled to perform the integration of the knock signal during a time period in which the integration of the first reference voltage of the integrating circuit is being performed.

16. A signal processing circuit as set forth in claim 14, wherein the calculation processing means performs the integration of the first reference voltage of the integrating circuit in units of at least one of a prescribed number of ignition times and a prescribed time period.

17. A signal processing circuit as set forth in claim 7, wherein the calculation processing means performs, when the number of rotations of an internal combustion engine is smaller than a prescribed number of rotations, integration of the first reference voltage of the integrating circuit within a knock determination time period in units of ignition and performs, when the number of rotations of the internal combustion engine exceeds the prescribed number of rotations, integration of the first reference voltage of the integrating circuit in units of the prescribed number of ignition times continuously over a plurality of the knock determination time periods until the prescribed amount of integrating time lapses.

18. A signal processing circuit as set forth in claim 17, wherein the calculation processing means is disabled to perform the integration of the knock signal during a time period in which the integration of the first reference voltage of the integrating circuit is being performed.

19. A signal processing circuit as set forth in claim 7, wherein the calculation processing means performs the integration of the first reference voltage of the integrating circuit at an initial processing time when an initialization is executed.

20. A signal processing circuit as set forth in claim 5, wherein the calculation processing means performs peak-hold of the first reference voltage of the peak-hold circuit within a time period of from a timing that corresponds to around a TDC of a piston of each cylinder of an engine to a knock determination time period.

21. A signal processing circuit as set forth in claim 5, wherein the calculation processing means performs peak-hold of the first reference voltage of the peak-hold circuit during a time period of from an end of a knock determination time period to a timing that corresponds to around a next TDC of an engine.

22. A signal processing circuit as set forth in claim 5, wherein the calculation processing means performs, when the number of rotations of an internal combustion engine is smaller than a prescribed number of rotations, peak-hold of the first reference voltage of the peak-hold circuit during a time period of from a TDC timing of an engine to a start of a knock determination time period and performs, when the number of rotations of the engine exceeds the prescribed number of rotations, peak-hold of the first reference voltage of the peak-hold circuit during a time period of from an end of the knock determination time period to a next TDC timing.

23. A signal processing circuit as set forth in claim 5, wherein the calculation processing means performs peak-hold of the first reference voltage of the peak-hold circuit at an initial processing time when an initialization is executed.

* * * * *